United States Patent
Wu et al.

(10) Patent No.: US 7,948,409 B2
(45) Date of Patent: May 24, 2011

(54) AUTOMATIC POWER CONTROL SYSTEM FOR OPTICAL DISC DRIVE AND METHOD THEREOF

(75) Inventors: Gwo-Huei Wu, Taipie Hsien (TW); Kuo-Jung Lan, Taipei County (TW); Yu-Hsuan Lin, Hsinchu (TW); You-Wen Chang, Hsinchu (TW)

(73) Assignee: Mediatek Inc., Hsin-chu (TW)

( * ) Notice: Subject to any disclaimer, the term of this patent is extended or adjusted under 35 U.S.C. 154(b) by 0 days.

(21) Appl. No.: 12/603,762

(22) Filed: Oct. 22, 2009

(65) Prior Publication Data

US 2010/0039908 A1 Feb. 18, 2010

Related U.S. Application Data

(63) Continuation-in-part of application No. 12/273,601, filed on Nov. 19, 2008, now Pat. No. 7,903,006, which is a continuation of application No. 11/758,119, filed on Jun. 5, 2007, now Pat. No. 7,474,235.

(60) Provisional application No. 60/811,017, filed on Jun. 5, 2006.

(51) Int. Cl.
 *H03M 1/10* (2006.01)
(52) U.S. Cl. .................. 341/120; 341/110; 341/155

(58) Field of Classification Search .................. 341/110, 341/120, 118, 144, 155; 369/47.51, 47.53; 375/354, 229, 343, 372
See application file for complete search history.

(56) References Cited

U.S. PATENT DOCUMENTS

| | | | |
|---|---|---|---|
| 6,424,687 B1 | 7/2002 | Tian et al. | |
| 6,775,214 B2 * | 8/2004 | Suzuki | 369/47.51 |
| 7,171,608 B2 * | 1/2007 | Aida et al. | 714/794 |
| 7,551,524 B2 * | 6/2009 | Colbum et al. | 369/13.27 |
| 2003/0099177 A1 * | 5/2003 | Wang et al. | 369/53.26 |
| 2004/0013065 A1 * | 1/2004 | Udagawa | 369/47.51 |
| 2004/0264021 A1 * | 12/2004 | Lim et al. | 360/31 |
| 2005/0083282 A1 | 4/2005 | Honbo | |
| 2007/0019772 A1 | 1/2007 | Spires et al. | |
| 2007/0047635 A1 | 3/2007 | Stojanovic et al. | |
| 2008/0056086 A1 * | 3/2008 | Kuroda | 369/53.26 |
| 2008/0151714 A1 * | 6/2008 | Kakimoto | 369/47.53 |

* cited by examiner

*Primary Examiner* — Peguy JeanPierre
(74) *Attorney, Agent, or Firm* — Thomas|Kayden

(57) ABSTRACT

A method for calibrating an initial driving signal for driving an optical pick-up head of an optical disk drive is provided. On one embodiment, said optical disk drive is utilized for reading or writing data on an optical disk, the optical disk comprises a plurality of auto power control areas (APC areas) and a plurality of data areas, and the APC areas and the data areas are interleaved in between. First, in the APC areas, an initial driving signal is used to drive the optical pick-up head to emit laserbeam. A detected level of the laserbeam is then obtained. An update initial driving signal is then calibrated according to the detected level and a target level.

20 Claims, 20 Drawing Sheets

AUTOMATIC POWER CONTROL SYSTEM FOR OPTICAL DISC DRIVE AND METHOD THEREOF

CROSS REFERENCE TO RELATED APPLICATIONS

This application is a Continuation-In-Part of U.S. patent application Ser. No. 12/273,601, filed on Nov. 19, 2008 now U.S. Pat. No. 7,903,006 and entitled "Automatic Power Control System For Optical Disc Drive And Method Thereof", which is a Continuation application of U.S. patent application Ser. No. 11/758,119, filed on Jun. 5, 2007 now U.S. Pat. No. 7,474,235, which claims the benefit of U.S. Provisional Application No. 60/811,017, filed on Jun. 5, 2006, the entirety of which are incorporated by reference herein.

BACKGROUND OF THE INVENTION

1. Field of the Invention

The invention relates to optical disk drives, and more particularly to automatic power control for optical disc drives.

2. Description of the Related Art

A pickup head of an optical disk drive projects a laserbeam onto a data layer of an optical disk to write data thereto or read data therefrom. When the pickup head emits the laserbeam with a high power level, the laserbeam melts the data layer of the optical disk or changes the phase of the data layer, scarfing data patterns thereon, thereby recording data onto the optical disk. When the pickup head emits the laserbeam with a low power level which can not melt/change the data layer of the optical disk, the pickup head decodes data according to the pattern of the reflection of the laserbeam from the disk, thereby reading data from the optical disk. A pickup head of an optical disk therefore must be capable of generating laserbeams with different power levels corresponding to the different functions of the optical disk drive.

A pickup head generates a laserbeam with a laser diode. The power level of the laserbeam emitted by the laser diode is controlled by a driving current. When the pickup head continues to generate the laserbeam, the laserbeam gives off heat which increases the temperature of the pickup head. Along with increasing temperature of the pickup head, driving current must be increased, thus controlling the laser diode to emit the laserbeam with a constant power level. Referring to FIG. 1, a schematic diagram of a relationship between a driving current level and a laserbeam power level is shown. When the pickup head is operated in a temperature $T_1$, the relationship between the driving current level and the laserbeam power level is depicted by a line $L_0$. When the temperature of the pickup head is changed to $T_2$, the relationship between the driving current level and the laserbeam power level is changed to lines $L_1$ or $L_2$. The lines $L_0$ and $L_1$ have different offset levels $Ith(T_1)$ and $Ith(T_2)$ for generating a laserbeam with a minimum power level, and the lines $L_0$ and $L_2$ have different slopes $s(T_1)$ and $s(T_2)$.

To prevent the power level of the laserbeam from decreasing when the temperature of the pickup head increases, the optical disk drive must comprise an automatic power control mechanism to adjust the driving current of the laser diode according to the temperature, thus maintaining the laserbeam at a constant power level. Referring to FIG. 2, a schematic diagram of signals generated by a conventional automatic power control mechanism is shown. The conventional automatic power control mechanism is a closed-loop control mechanism. When a pickup head writes data to an optical disk with a laserbeam, the pickup head generates a driving current for controlling a laser diode (LD) to generate the laserbeam, and a front monitor diode (FMD) detects the power of laserbeam and generate an FMD output signal. The FMD output signal is sampled as references for adjusting the driving current of the laser diode. In FIG. 2, the laserbeam generated by the laser diode comprises multiple power levels, such as cooling power, erase power, write power, and over drive power, etc., in order to write data onto disk. Two power levels including for example a write power level and an erase power level are respectively sampled according to corresponding sample pulses for power level adjustment.

When the optical disk is a blu-ray disk, data density is increased. The laserbeam for writing data onto the blu-ray disk therefore has power levels that last for a shorter duration which is becoming smaller as recording speed getting higher. Referring to FIG. 3, a schematic diagram of signals generated by an automatic power control mechanism corresponding to a blu-ray disk is shown. There are two different writable area in a blu-ray disk, the data area and the APC area. APC area is utilized to perform automatic power control and data area is utilized to write the normal data. When a pickup head writes data (such us NRZ (Non-Return to Zero) signal in FIG. 3) to the blu-ray disk with a high recording speed, each power level of the laserbeam only lasts for a short duration. Because a front monitor diode requires a longer time period to appropriately generate a stable output signal, the FMD output signal does not converge to a real amplitude during the period for each power level and cannot be taken as feedback for correct automatic power control. The APC area is being set to solved this problem, but the APC area is relative smaller to the data area and the drive may not have enough time to get a stable write power in the beginning of the data writing. A method for automatic power control for an optical disk drive is therefore required.

BRIEF SUMMARY OF THE INVENTION

A method for calibrating an initial driving signal for driving an optical pick-up head of an optical disk drive is provided. On one embodiment, said optical disk drive is utilized for reading or writing data on an optical disk, the optical disk comprises a plurality of auto power control areas (APC areas) and a plurality of data areas, and the APC areas and the data areas are interleaved in between. First, in the APC areas, an initial driving signal is used to drive the optical pick-up head to emit laserbeam. A detected level of the laserbeam is then obtained. An update initial driving signal is then calibrated according to the detected level and a target level.

The invention also provides an automatic power control system of an optical disk drive having a pick-up head with a front monitor diode. In one embodiment, said optical disk drive is utilized for reading or writing data on an optical disk, the optical disk comprising a plurality of auto power control areas (APC areas) and a plurality of data areas, and the automatic power control system comprises a power initialization unit and a compensator. In the APC areas, the power initialization unit outputs an initial driving signal to drive the optical pick-up head to emit laserbeam. The compensator obtains a detected level of the laserbeam detected by the front monitor diode, and calibrating an update initial driving signal according to the detected level and a target level.

The invention also provides an automatic power control system for an optical disc drive to control the power of a laser beam. In one embodiment, the optical disc drive comprises a optical pickup head for receiving a driving signal to generate the laser beam and a front monitor diode for detecting the laser beam to generate an analog input signal, and the automatic power control system comprises an analog-to-digital converter, a compensator, a controller, and a digital-to-analog converter. The analog-to-digital converter converts the analog input signal into digital data. The compensator is coupled to the analog-to-digital converter. When a compensating trigger signal is enabled, the compensator generates at least one component driving data according to the digital data and a target level. The controller coupled to the analog-to-digital converter and the compensator enables a compensating trigger signal. The digital-to-analog converter coupled to the comparator converts the component driving data to analog to generate a component driving signal.

The invention also provides a method for automatic power control for an optical disc drive. In one embodiment, the optical disc drive comprises an optical pick up head for receiving a driving signal to generate a laser beam and a front monitor diode for detecting the laser beam to generate an analog input signal. First, the analog input signal is converted into digital data when a digitizing trigger signal is enabled. At least one component driving data is then generated according to the digital data and a target level when a compensating trigger signal is enabled. The component driving data is then converted to analog to generate a component driving signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out embodiments. This description is made for the purpose of illustrating the general principles of the embodiments of the invention and should not be taken in a limiting sense. The scope of the embodiments of the invention is best determined by reference to the appended claims.

Figure 1:
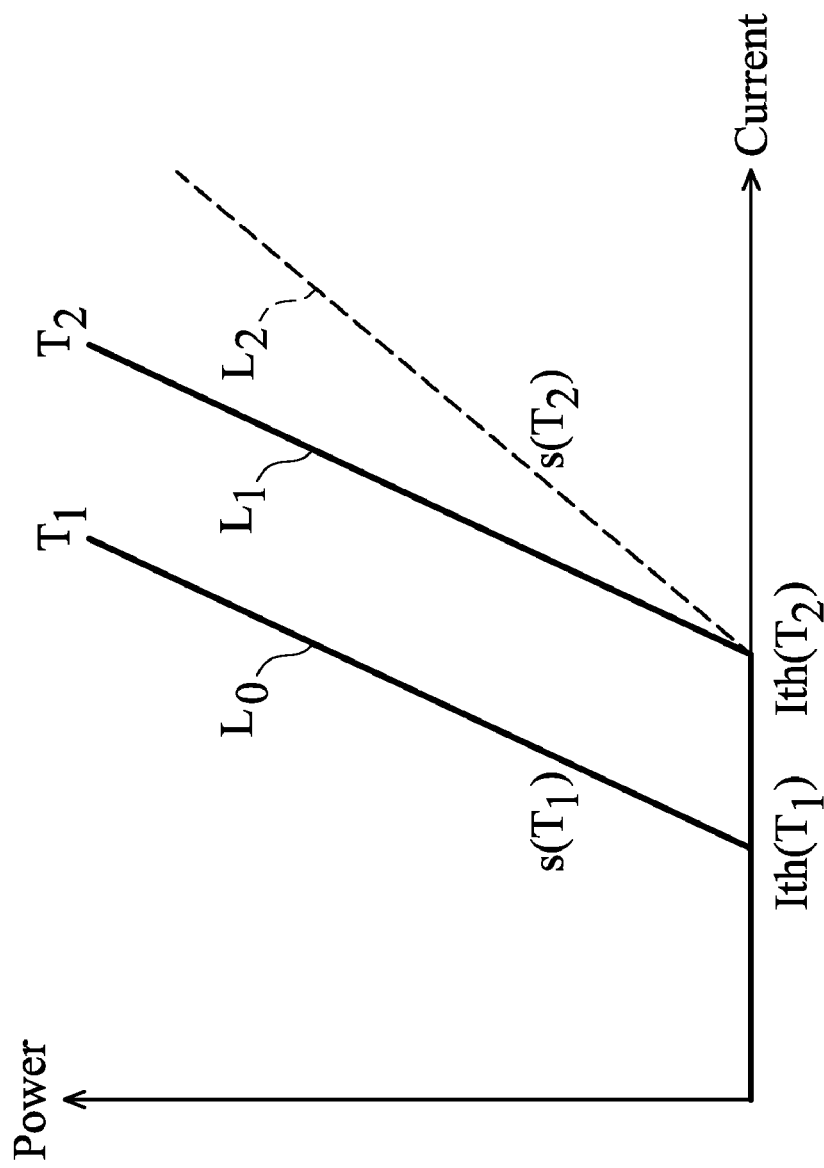
FIG. 1 is a schematic diagram of a relationship between a driving current level and a laserbeam power level.
Figure 2:
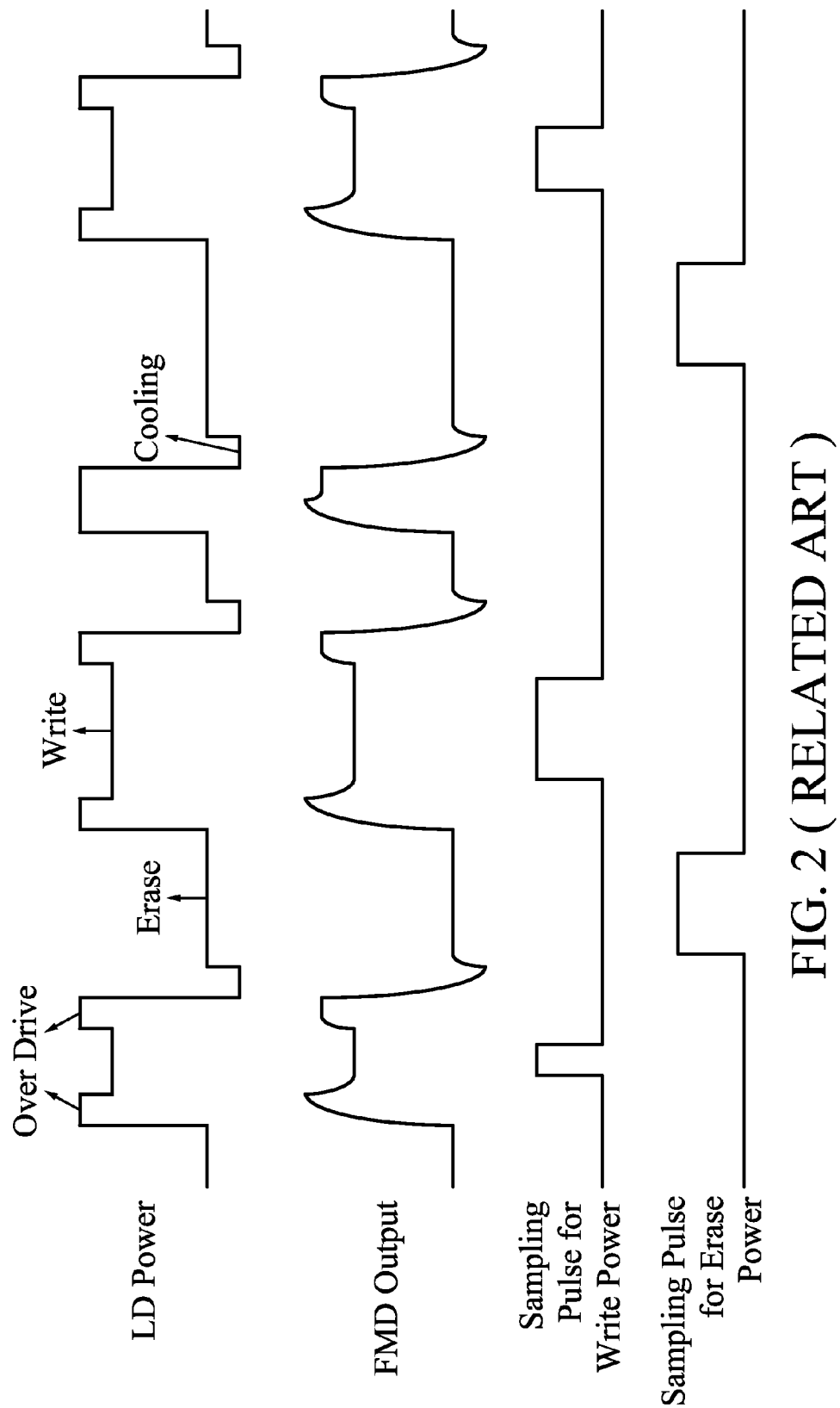
FIG. 2 is a schematic diagram of signals generated by a conventional automatic power control mechanism.
Figure 3:
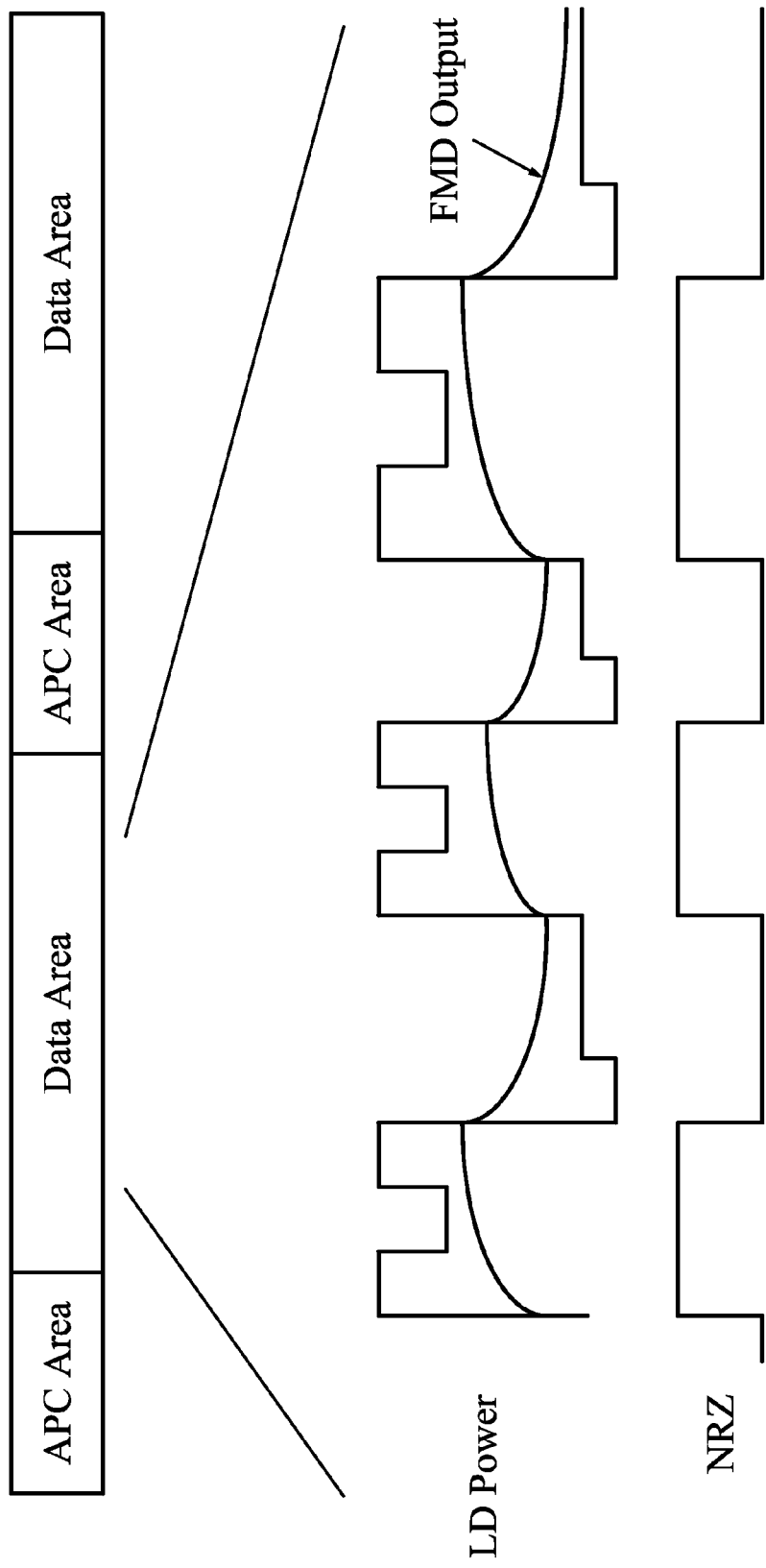
FIG. 3 is a schematic diagram of signals generated by an automatic power control mechanism corresponding to a blue-ray disk.
Figure 4:
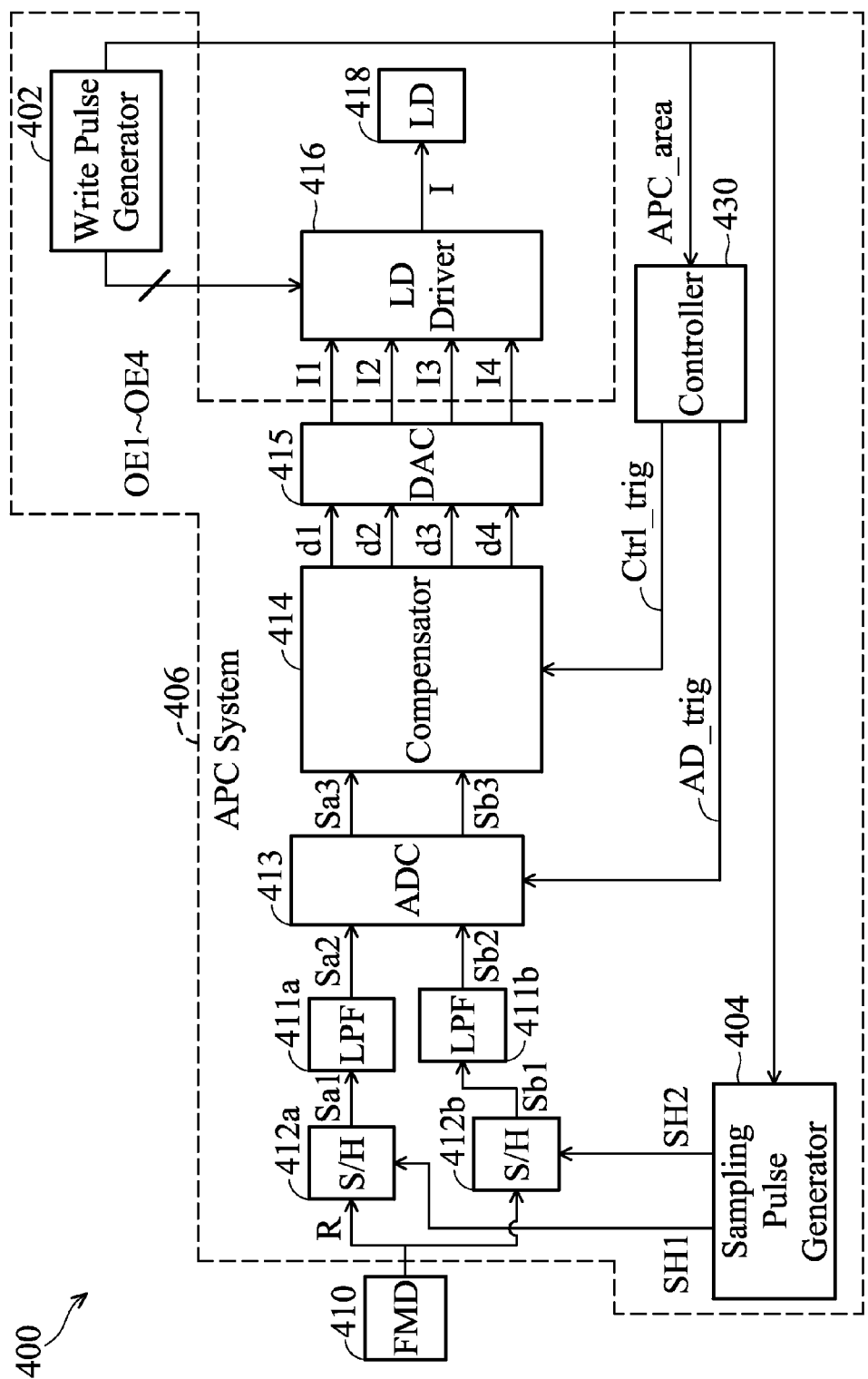
FIG. 4 is a block diagram of an embodiment of an automatic power control system according to one of the embodiments.

An automatic power control (APC) system controls a power level of a laserbeam emitted by a pickup head for an optical disk drive. Referring to FIG. 4, a block diagram of an optical disk drive 400 comprising an automatic power control system 406 according to one of the embodiments is shown. In one embodiment, the optical disk drive 400 comprises a front monitor diode 410, the automatic power control (APC) system 406, a laser diode driver (LD driver) 416, and a laser diode (LD) 418. The laser diode driver 416 generates a driving signal I according to a plurality of driving component signals I1~I4 and a plurality of driver enable signal OE1~OE4. The laser diode 418 then emits a laser beam with a power level determined by the driving signal I. Because the power level of the laserbeam reduces with the various operation condition (such as temperature increase or rotational speed increase). The APC system 406 therefore performs an automatic power control process to adjust the driving current I of the laser diode 418 in response to the various operation conditions, thus keeping the power level of the laser beam emitted by the laser diode 418 constant.

Figure 5:
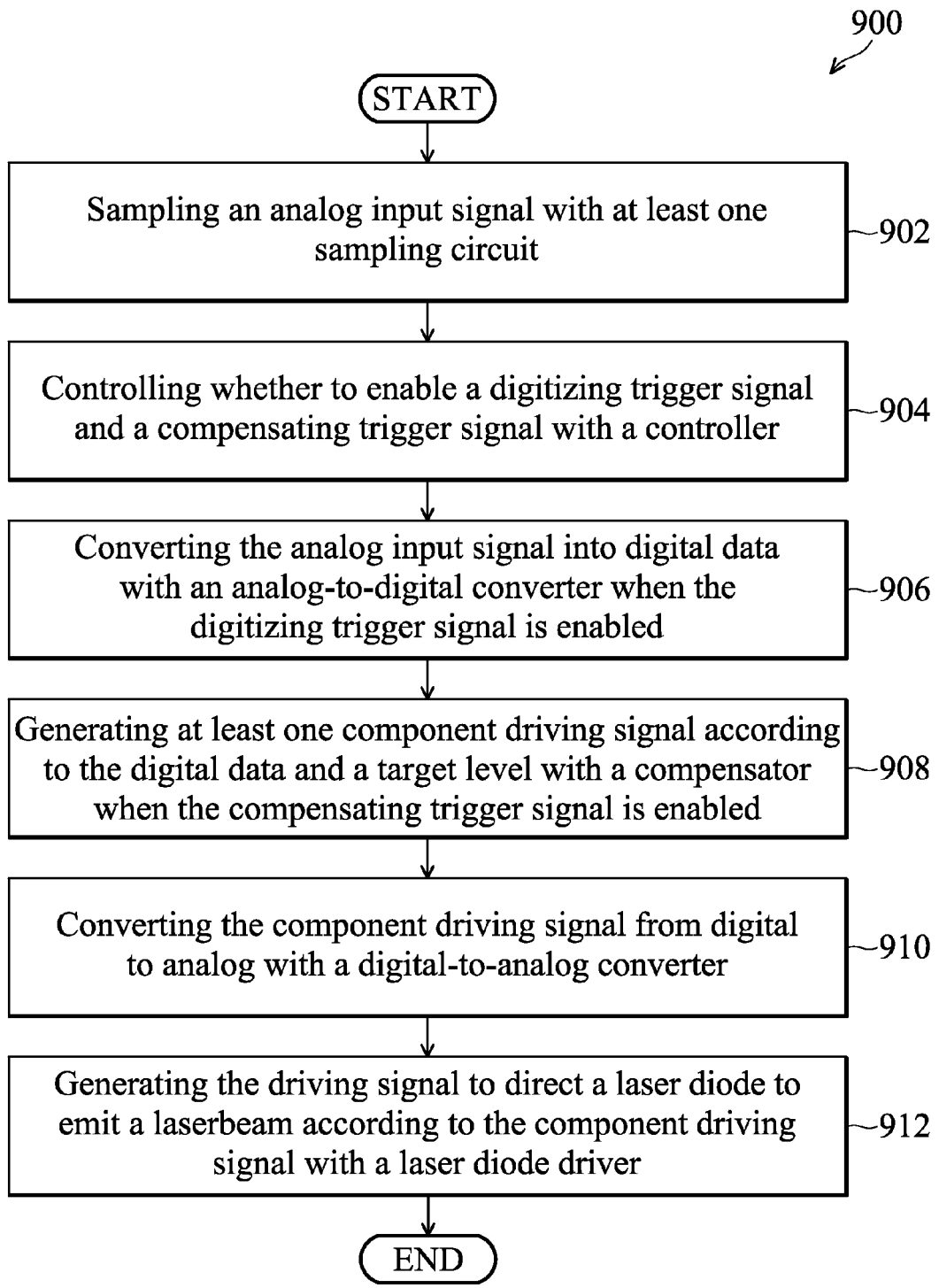
FIG. 5 is a flowchart of a method for automatic power control for an optical disk drive according to one of the embodiments.

The front monitor diode 410 first samples a laser diode output power to obtain an analog input signal R. The automatic power control system 406 then adjusts the driving component signals I1~I4 according to the analog input signal R. In one embodiment, the automatic power control system 406 comprises a write pulse generator 402, a sampling pulse generator 404, a controller 430, two sample and hold circuits 412a and 412b, two low pass filters (LPF) 411a and 411b, an analog-to-digital converter (ADC) 413, a compensator 414, and a digital to analog converter (DAC) 415. In this embodiment, although the laser diode 418 emits a laserbeam with a plurality of probable power levels, the automatic power control system 406 only uses two of the power levels to control the whole power levels. In this embodiment, using a write power level and an erase power level as an example. Referring to FIG. 5, a flowchart of a method for automatic power control for an optical disk drive 400 according to an embodiment of the invention is shown. First, the sample and hold circuits 412a and 412b respectively sample the analog input signal R according to sampling pulse signals SH1 and SH2 to obtain two analog input signals Sa1 and Sb1 respectively corresponding to the write power level and erase power level (step 902). The sampling pulse signals SH1 and SH2 are generated by the sampling pulse generator 404 to indicate which segment of the analog input signal R respectively corresponds to the power levels. The low pass filters 411a and 411b then respectively filter the analog input signals Sa1 and Sb1 to obtain signals Sa2 and Sb2.

When the low pass filters 411a and 411b initially generates the filtered analog input signals Sa2 and Sb2, the filtered analog input signals Sa2 and Sb2 are not stable and not available for further processing. The controller 430 then determines the timings for enabling a digitizing trigger signal AD_trig and a compensating trigger signal Ctrl_trig (step 904). In one embodiment, the controller 430 enables the digitizing trigger signal AD-trig when the filtered analog input signals Sa2 and Sb2 are stable. In one embodiment, the controller 430 will base on a signal APC_area to generate the digitizing trigger signal AD_trig and the compensating trigger signal Ctrl_trig. A disk surface read or written by the optical disk drive 400 is assumed to be divided into a plurality of auto power control areas (APC areas) and a plurality of data areas, wherein the APC areas and the data areas are spaced in between. The data areas are used for common data storage, and the APC areas are reserved for performing automatic power control processes. The APC-area signal indicates whether a laserbeam is projected on the APC areas of the disk surface.

When the digitizing trigger signal AD-trig is enabled, the analog-to-digital converter 413 then converts the filtered analog input signals Sa2 or Sb2 from analog to digital to obtain digital data Sa3 or Sb3 (step 906). Similarly, when analog-to-digital converter 413 initially generates the digital data Sa3 or Sb3, the digital data Sa3 or Sb3 are not stable and not available for further processing. The controller 430 therefore enables the compensating trigger signal Ctrl-trig when the digital data Sa3 or Sb3 is stable. When the compensating trigger signal Ctrl-trig is enabled, the compensator 414 then generates component current signals d1, d2, d3, and d4 according to the digital data Sa3 or Sb3 and a target level (step 908). In one embodiment, the compensator 414 compares the digital data Sa3 (detected from the write power level) with a target write power level to generate a power level offset, and then adjusts the driving component signal d3 (which use to drive the laser diode to emit write power level) to obtain an updated driving component signal d3 according to the power level offset. Because the power levels are proportional, in one embodiment, the other updated driving component signals can be calculated base on the proportional and the power level offset.

The digital to analog converter 415 then converts the component current signals d1, d2, d3, and d4 from digital to analog to obtain component current signals I1, I2, I3, and I4 (step 910). The laser diode driver 416 then generates a driving current I according to the component current signals I1, I2, I3, and I4 (step 912) and OE1~OE4. The write pulse generator 402 generates driver enable signals OE1, OE2, OE3, and OE4 respectively corresponding to the component current signals I1, I2, I3, and I4. When a driver enable signal OEi is enabled, the laser diode driver 416 adds a corresponding component current signal Ii to the driving current I. Finally, the laser diode 418 generates the laserbeam with a power level determined by the driving current I, thus completing the automatic power control process. Thus, even if the temperature of the laser diode 118 changes, the laser diode 118 can still generate the laserbeam with an accurate power level P after the automatic power control process is performed. The optical disk drive 400 can then continue data writing.

Figure 6:
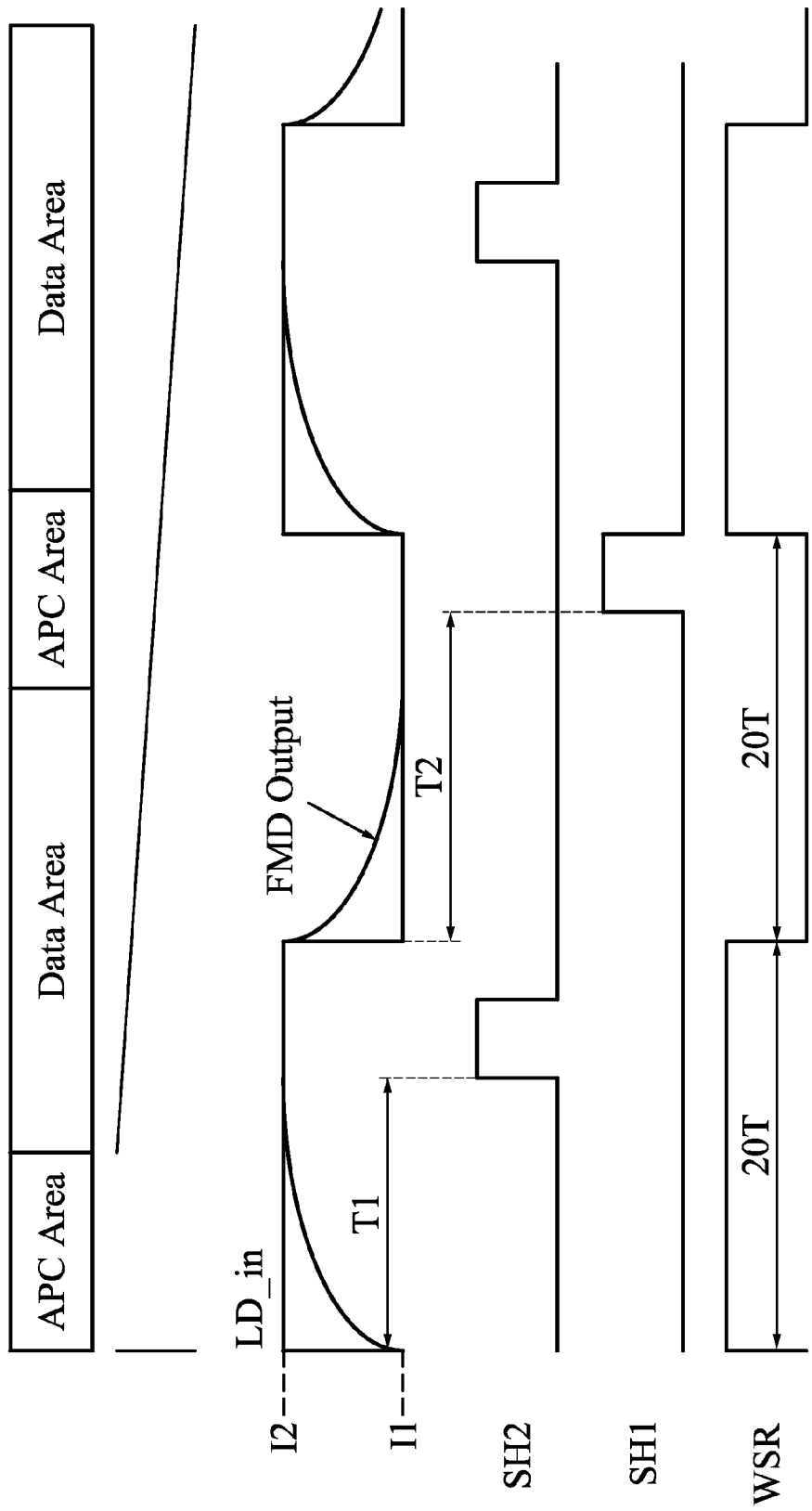
FIG. 6 is a schematic diagram of an embodiment of sampling of the detector output signal generated by the photo detector.

Referring to FIG. 6, a schematic diagram of an embodiment of sampling of the analog input signal generated by the front monitor diode (FMD) is shown. When an automatic power control process is performed. The laser diode 418 projects a laserbeam on an APC area according to the control of write pulse generator, which is represent in signal WSR in FIG. 6. The power level of the laserbeam is alternately changed between two power levels I2 and I1. In one embodiment, each power level has a duration of 20T which is a minimum time period to make FMD output stable. The front monitor diode 410 needs time T1 to stably detect the power level I2, and needs time T2 to stably detect the power level I1. After each segment of the analog input signal is stable, the sampling pulse generator 404 generates the sampling pulses SH1 and SH2 to trigger the sample and hold circuits 412a and 412b to sample the analog input signal, thus obtaining the analog input signals Sa1 and Sb1.

Figure 7:
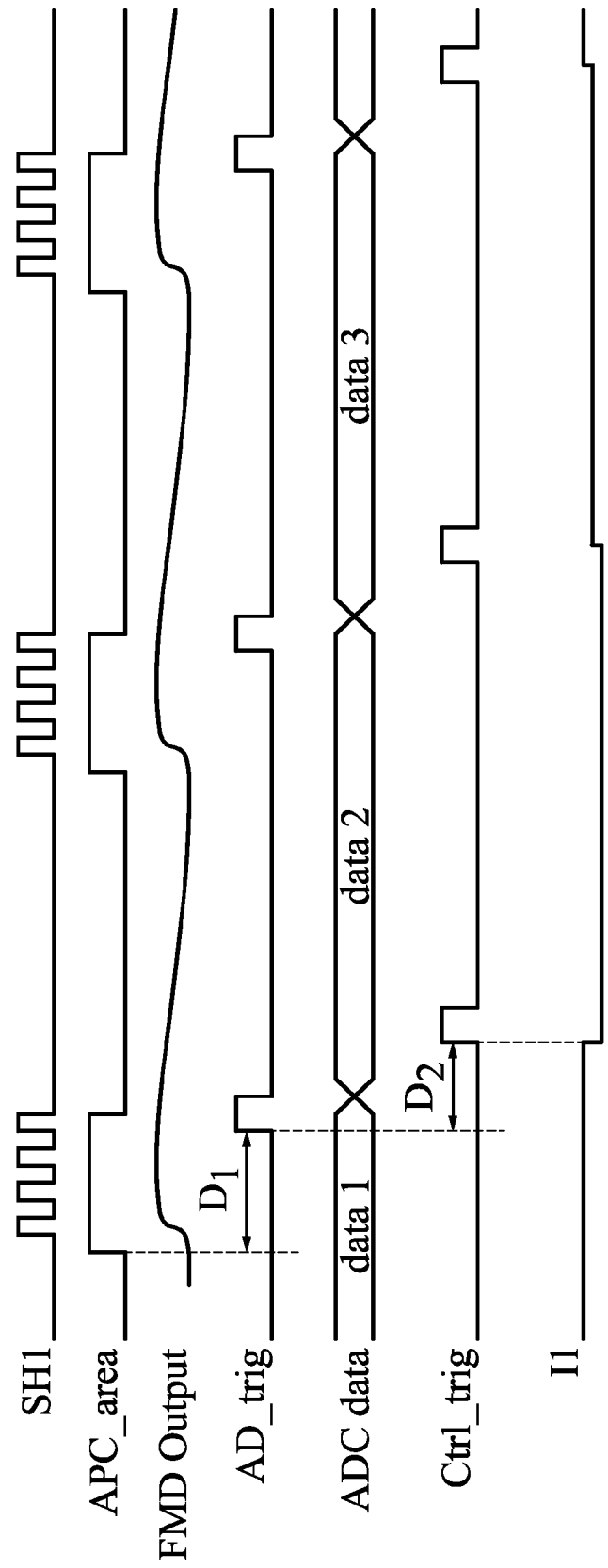
FIG. 7 is a schematic diagram of an embodiment of operations of the analog-to-digital converter and the compensator of FIG. 5.

Referring to FIG. 7, a schematic diagram of an embodiment of operations of the analog-to-digital converter 413 and the compensator 414 is shown. When the laser diode 418 is on APC areas of the disk surface, the automatic power control system 400 performs automatic power control processes. After the front monitor diode 410 generates an analog input signal, the sampling pulse generator 404 generates a sampling pulse signal SH1 indicating the segment of the analog input signal corresponding to a first power level, and the sample and hold circuit 412a samples the analog input signal according to the sampling pulse signal SH1 to obtain the analog input signal Sa1. When the analog input signal Sa1 is stable, the controller 430 enables the digitizing trigger signal AD_trig, and the analog-to-digital converter 413 starts to convert the analog input signal Sa1 from analog to digital to obtain an ADC data stream Sa3. When the ADC data stream Sa3 is stable, the controller 430 enables the compensating trigger signal Ctrl_trig, and the compensator 414 starts to adjust the component driving current I1 according to the ADC datastream Sa3. The digitizing trigger signal has a delay D1 in comparison to an ADC_area signal indicating whether the disk surface illuminated by the laserbeam is an APC area, and the compensating trigger signal Ctrl_trig has a delay D2 in comparison to the digitizing trigger signal D2. In one embodiment, the delay values D1 and D2 are zero. In addition, the APC system 400 can normally operate according to merely the compensating trigger signal Ctrl_trig even if no digitizing trigger signal AD_trig is generated. In one embodiment, the controller 430 only generates the compensating trigger signal Ctrl_trig to trigger compensation operations of the compensator 414, and the analog-to-digital converter 413 directly converts the analog signals Sa2 and Sb2 to digital signals Sa3 and Sb3 without limiting of the digitizing trigger signal AD_trig.

Figure 8:
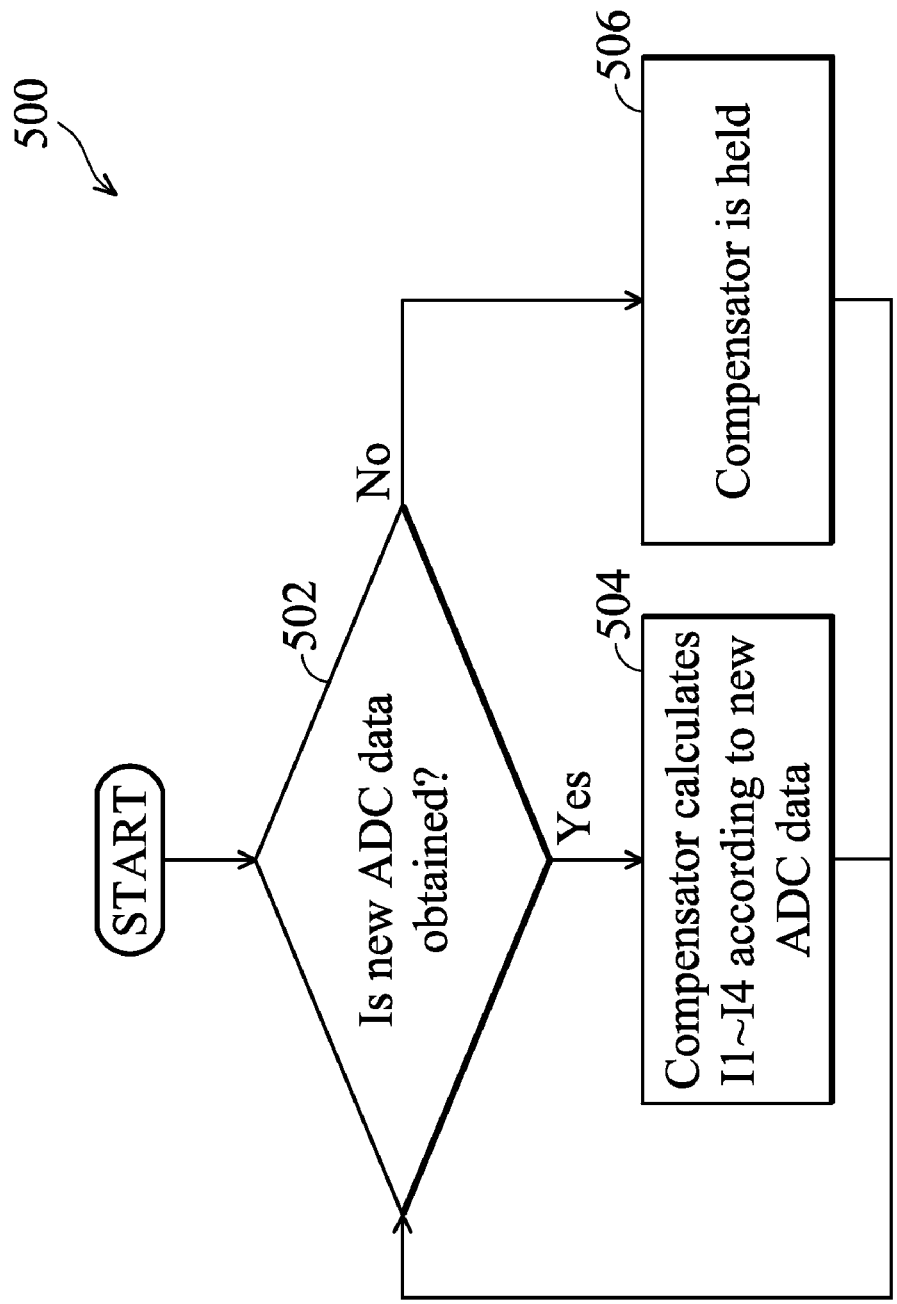
FIG. 8 is a flowchart of an operation method of a compensator according to one of the embodiments.

Referring to FIG. 8 a flowchart of an operation method of the compensator 414 according to one of the embodiments is shown. When the sampling and hold circuits 412a and 412b samples new sampled data Sa1 and Sb1, and the analog-to-digital converter 413 generates new digital data Sa3 and Sb3 according to the new sampled data Sa1 and Sb1 (step 502), the compensator 414 adjusts the component driving currents I1~I4 according to the new digital data Sa3 and Sb3 (step 504). Otherwise, when the sampling and hold circuits 412a and 412b samples no data Sa1 and Sb1, the analog-to-digital converter 413 generates no data Sa3 and Sb3 (step 502), and the compensator 414 makes no adjustment to the component driving currents I1~I4 (step 506). In other embodiment, the ADC can directly sample the analog input signal without the sample and hold circuit, and compensator will be controlled by the control signal Ctrl_trig to calculate the component driving current I1~I4.

Figure 9:
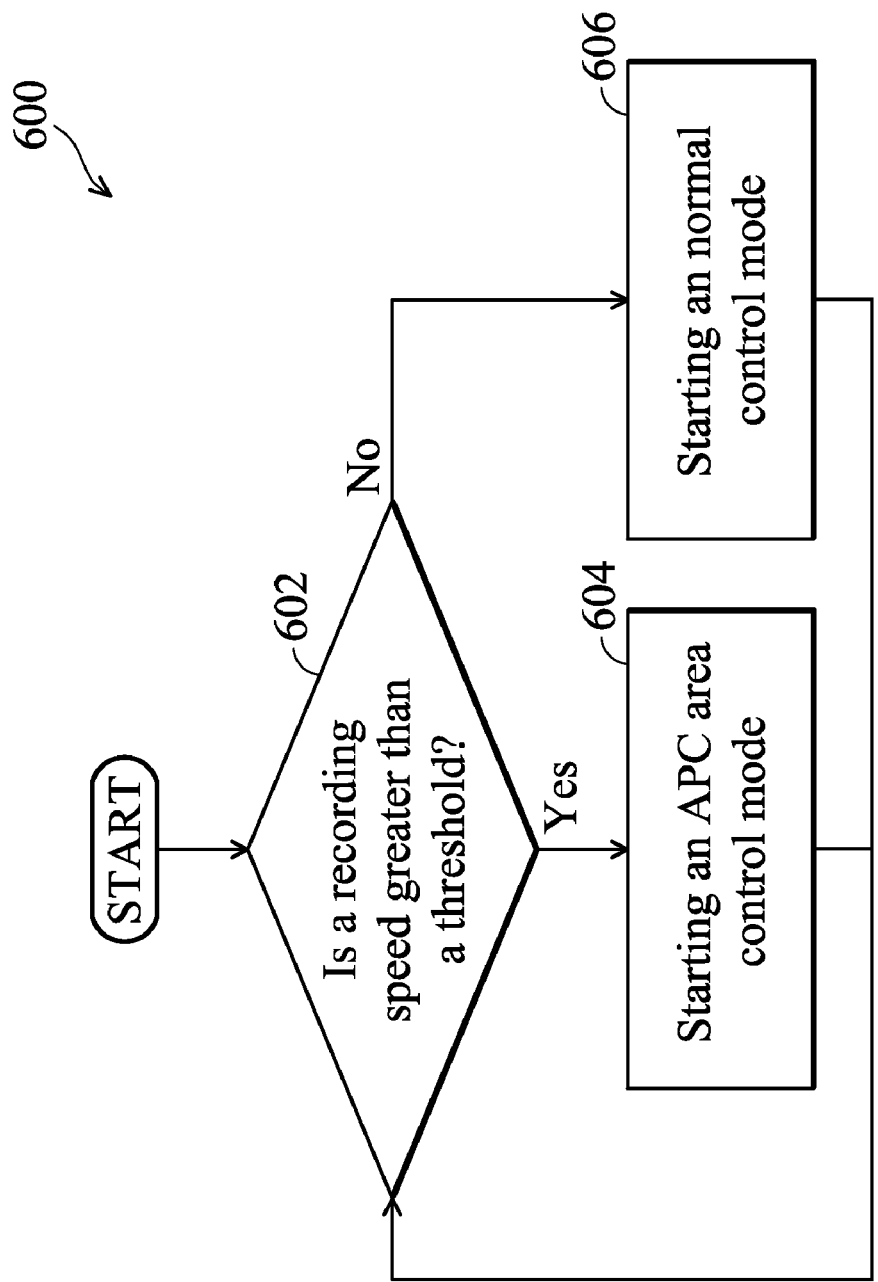
FIG. 9 is a flowchart of a method for making selection between a normal control mode and an APC control mode.

The aforementioned automatic power control process provided by one of the embodiments is performed when the laserbeam emitted by the laser diode 418 is projected on an APC area. The aforementioned automatic power control process is therefore referred to as an APC area control mode automatic power control process. A conventional automatic power control process, however, is performed in companion with normal data writing on a data area. The conventional automatic power control process is therefore referred to as a normal control mode automatic power control process. The normal control mode automatic power control process operates with errors when a recording speed of the automatic power control system 400 surpasses a high speed level. A method for making a selection between the normal control mode and the APC control mode is therefore provided. Referring to FIG. 9, a flowchart of a method 600 for making selection between the normal control mode and the APC control mode is shown. When the recording speed of the automatic power control system 400 is greater than a threshold (step 602), the APC area control mode is determined (step 604). Otherwise, when the recording speed of the automatic power control system 400 is lower than the threshold (step 602), the normal control mode is determined (step 606).

Figure 10:
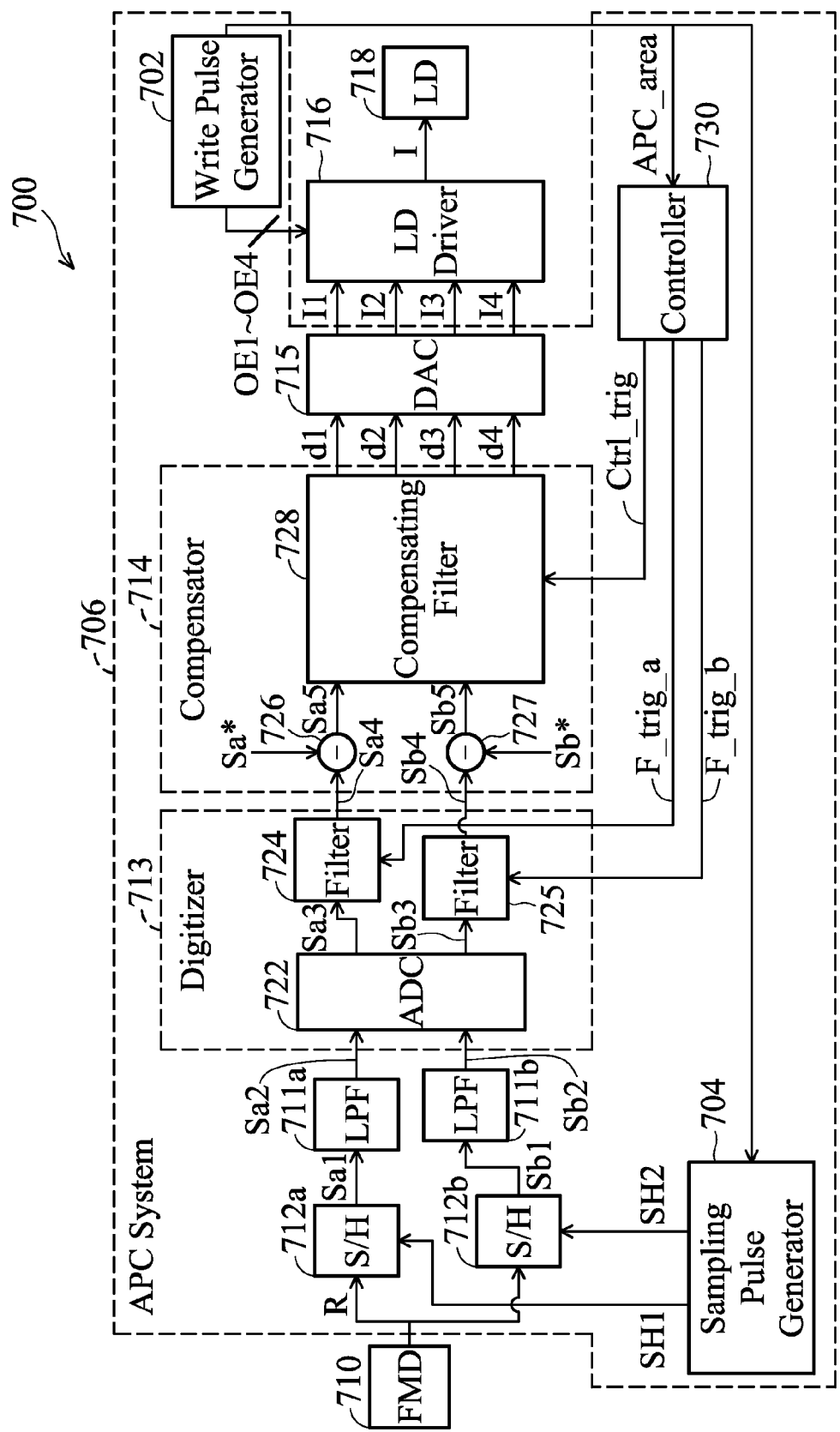
FIG. 10 is a block diagram of another embodiment of an automatic power control system of an optical disk drive according to one of the embodiments.

Referring to FIG. 10, a block diagram of another embodiment of an optical disk drive 700 comprising an APC system 706 according to one of the embodiments is shown. The optical disk drive 700 shown in FIG. 10 is similar to the automatic power control system 400 shown in FIG. 4, except for a digitizer 713, a compensator 714, and a controller 730. In one embodiment, the digitizer 713 comprises an analog-to-digital converter 722 and two filters 724 and 725. The analog-to-digital converter 722 converts analog input signals Sa2 and Sb2 from analog to digital to obtains digital data Sa3 and Sb3. When the analog-to-digital converter 722 initially generates the digital data Sa3 and Sb3, the digital data Sa3 and Sb3 are not stable and not suitable for further processing. When the digital data Sa3 and Sb3 are stable, the controller 730 enables filtering trigger signals F_trig_a and F_trig_b, and the filters 724 and 725 then start to filter the digital data Sa3 and Sb3 to obtain the filtered digital data Sa4 and Sb4.

The filtered digital data Sa4 and Sb4 are then delivered to the compensator 714. In one embodiment, the compensator 714 comprises two subtractors 726 and 727 and a compensating filter 728. The subtractors 726 and 727 respectively subtract the digital data Sa4 and Sb4 from target levels Sa* and Sb* to obtain power level offset signals Sa5 and Sb5. The compensating filter 728 then filters the power level offset signals Sa5 and Sb5 to generate component driving signals d1, d2, d3, and d4. When the substractors 726 and 727 initially generate the power level offset signals Sa5 and Sb5, the power level offset signals Sa5 and Sb5 are not stable and not suitable for further processing. After the power level offset signals Sa5 and Sb5 are stable, the controller 730 enables the compensating trigger signal Ctrl_trig to trigger the compensating filter 414, and the compensating filter 414 starts filtration of the power level offset signals Sa5 and Sb5. In addition, the APC system 700 can normally operate according to merely the compensating trigger signal Ctrl_tig even if no filtering trigger signals F_trig_a and F_trig_b are generated. In one embodiment, the controller 730 only generates the compensating trigger signal Ctrl_tig to trigger compensation operations of the compensator 714, and the filters 724 and 725 directly filter the digital signals Sa3 and Sb3 to obtain the filtered digital signals Sa4 and Sb4 without using the filtering trigger signals F_trig_a and F_trig_b. In one embodiment, the compensating filter 728 is an integrator, When the compensating trigger signal Ctrl_tig is disabled, the compensating filter 728 does not integrate the signals Sa5 and Sa6, and the component current signals d1, d2, d3, and d4 are therefore held at original levels.

Figure 11:
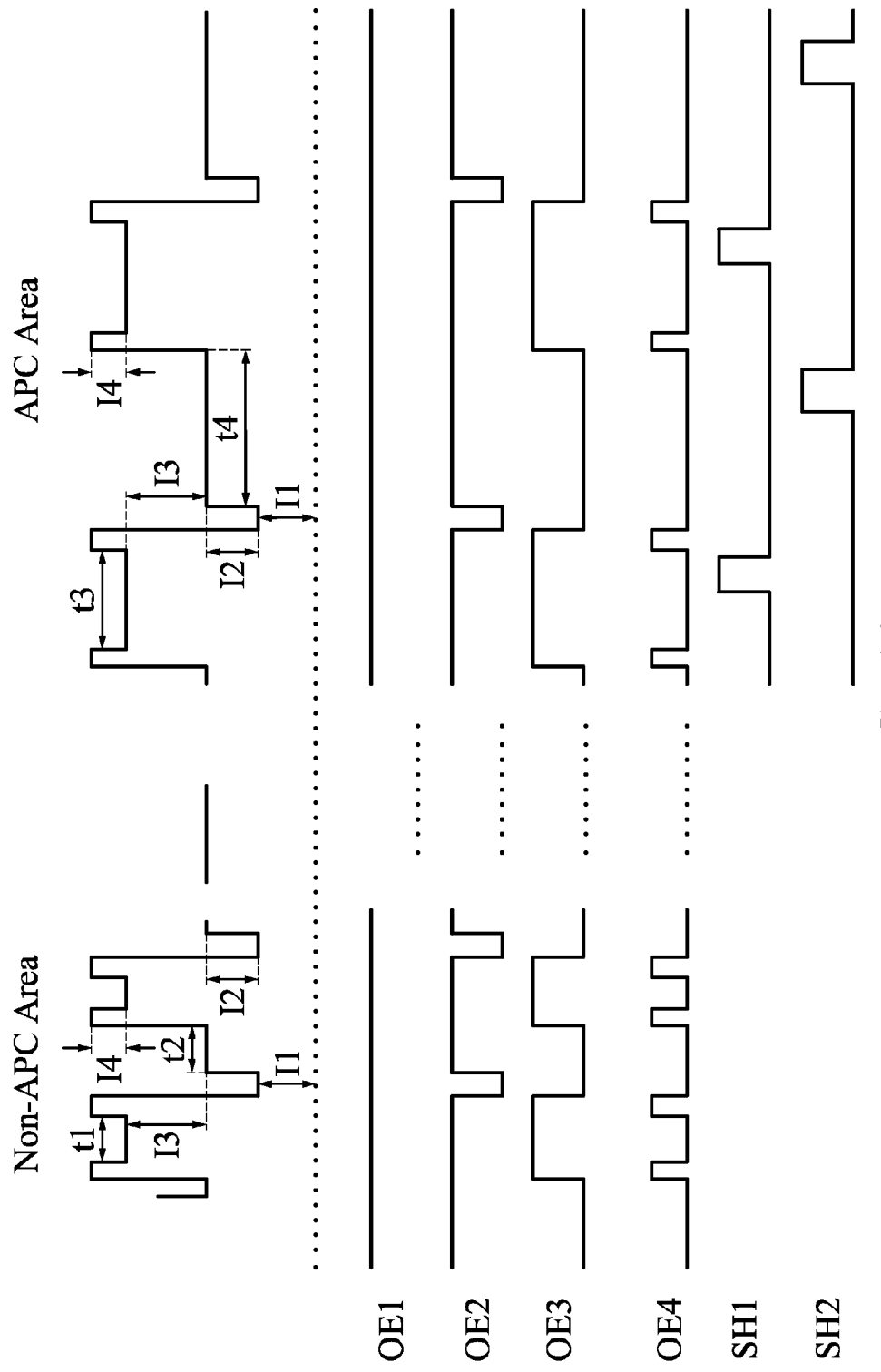
FIG. 11 is a schematic diagram of signals of an embodiment of an automatic power control process.

Referring to FIG. 11, a schematic diagram of signals of an embodiment of an automatic power control process is shown. When the pickup head is on an non-APC area such as a data area, the write pulse generator 402 generates driver enable signals OE1~OE4 to control the laser diode driver 416 to generate the driving current I, and a power curve of the laser beam is shown on the upper half of FIG. 11. When the pickup head writes the normal data on the data area, the driving current is changed very fast and the APC system is difficult to have a stable detected level to be used to calculate an updated driving signal. When the pickup head is on an APC area, the write pulse generator 402 can generate driver enable signals OE1~OE4 by a predetermined condition to control the laser diode driver 416 to generate the driving current I, in addition, the durations of each enabled segment of the driver enable signals OE1~OE4 can be setup to extend. For example, in comparison with the duration periods t1 and t2, the duration periods t3 and t4 corresponding to the two power levels are extended. The front monitor diode 410 can therefore generate a stable analog input signal R, and the sample and hold circuits 412a and 412b can then sample the analog input signal R to obtain reliable data Sa1 and Sb1 as reference for compensation.

When a conventional APC controller adjusts a laser power of a pickup head, the APC power controller requires a predetermined transient time period to stabilize the laser power, and the laser power is unstable during the transient time period. In addition, a high temperature of the laser diode may increase the transient time period of the laser power. When data is recorded at a high speed, because a laser beam is projected on APC areas with a lower frequency, the sampling rate of a reflection power is lowered, and the APC controller requires a longer transient time period to stabilize the laser power. To reduce the transient time period for stabilizing the laser power, a method for setting the laser power with an accurate initial value is provided. If the laser power is set with an accurate initial value, the transient time period required by the APC controller to adjust the laser power is reduced.

Figure 12:
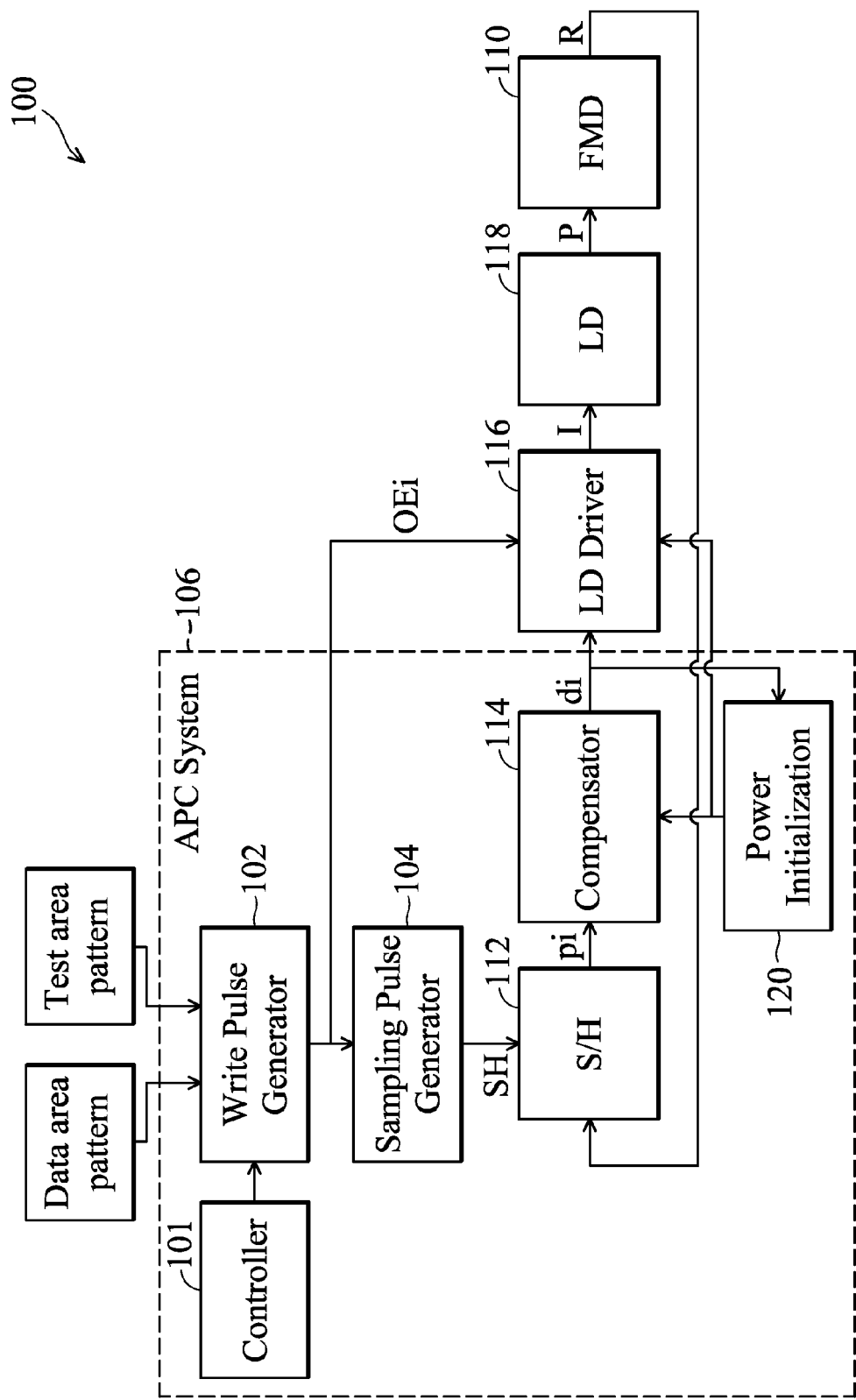
FIG. 12 is a block diagram of an automatic power control system of an optical disk drive according to one of the embodiments.

Referring to FIG. 12, a block diagram of an optical disk drive 100 comprising an automatic power control system 106 according to one of the embodiments is shown. In one embodiment, the optical disk drive 100 comprises the automatic power control (APC) system 106, a laser diode driver 116, a laser diode (LD) 118, and a front monitor diode (FMD) 110. In one embodiment, the automatic power control system 106 comprises a controller 101, a write pulse generator 102, a sampling pulse generator 104, a sample and hold circuit 112, a compensator 114, and a power initialization module 120. The laser diode driver 116 generates a driving signal I according to a plurality of driving component signals di and a driver enable signal OEi. The laser diode 118 then emits a laser beam with a power level P determined by the driving signal I. In this embodiment, the power initialization module 120 is used to set an initial driving current for each component current signals I1, I2, I3, and I4, in the beginning of data writing or recording. According to this embodiment, the optical disk drive has to determine the initial driving currents to overcome the problems mentioned above.

Figure 13:
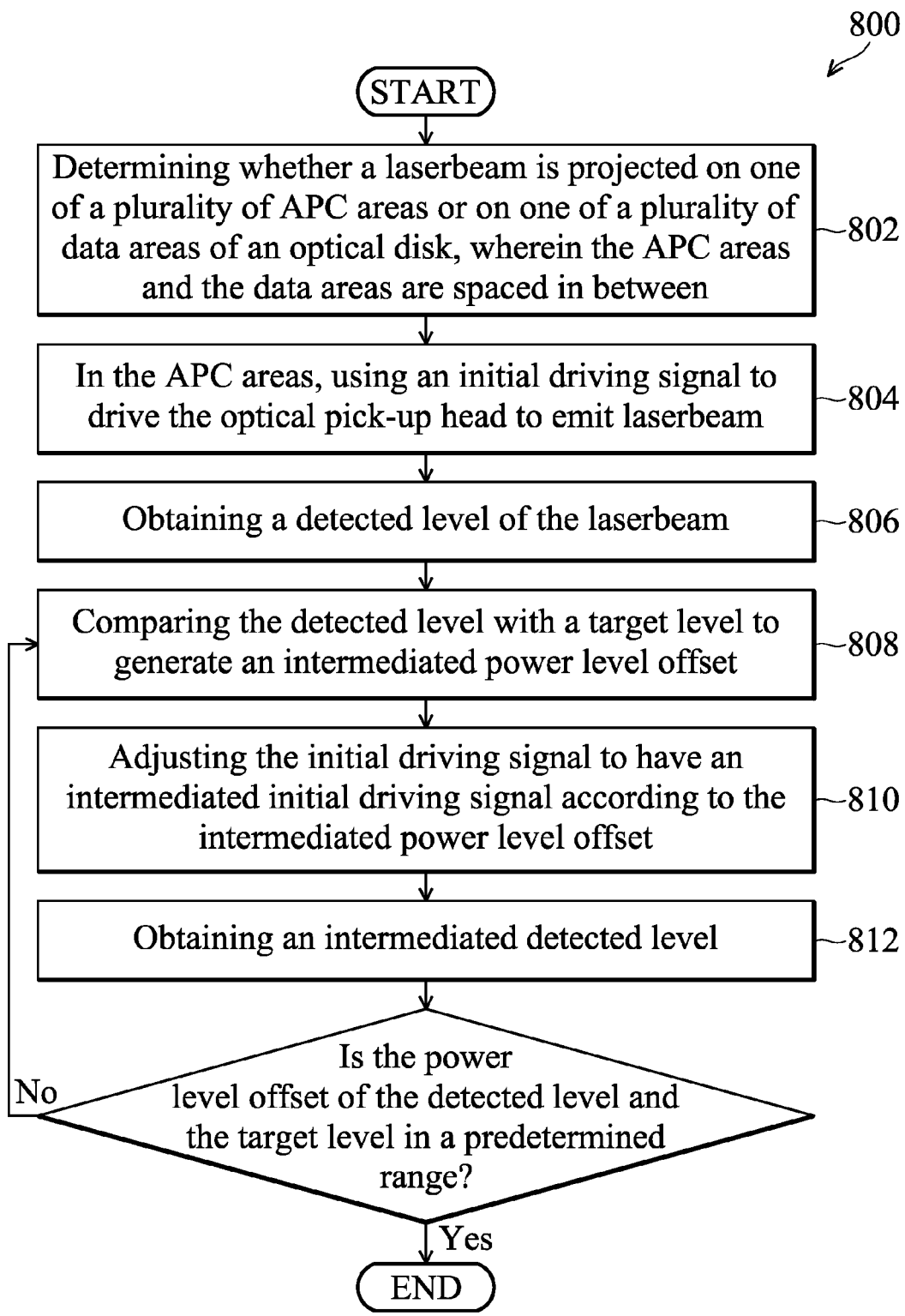
FIG. 13 is a flowchart of a method for automatic power control for an optical disk drive according to one of the embodiments.

Referring to FIG. 13, a flowchart of a method 800 of automatic power control for an optical disk drive 100 according to an embodiment of the invention is shown. A disk surface read or written by the optical disk drive 100 is assumed to be divided into a plurality of auto power control areas (APC areas) and a plurality of data areas, wherein the APC areas and the data areas are spaced in between. The data areas are used for common data storage. The APC areas are reserved for performing automatic power control processes. In one embodiment, the optical disk is a blu-ray disk (BD) and the optical disk drive utilizes the APC areas for determined the initial driving currents for a normal data writing/recording. First, the controller 101 determines whether the laser diode 118 is projecting the laserbeam on an APC area of the optical disk (step 802). When the laserbeam is projected on an APC area of the optical disk, the controller 101 directs the write pulse generator 102 to generate a driver enable signal OEi corresponding to a test area pattern. Otherwise, the controller 101 directs the write pulse generator 102 to generates a driver enable signal OEi corresponding to a data area pattern.

When the laserbeam is projected on the APC area of the optical disk, the automatic power control system 106 starts to perform an initial driving signal calibration process, thereby setting an initial driving signal for driving an optical pick-up head of the optical disk drive to emit laserbeam. When the laser beam is projected on one of the APC areas, the power initialization module 120 generates the initial component driving signals for the LD driver 114 to drive the laser diode 118 of the pickup head to emit a laserbeam corresponding to the laser power P (step 804). The laser diode 118 then projects a laserbeam with the at least one power level P onto the APC area according to the driving current I. In one embodiment, the at least one power level is selected from a read power, a cooling power (or someone called bias power), an erase power, a write power, and an over drive power.

The front monitor diode 110 then detects level of reflection of the laserbeam to obtain a detected signal R corresponding to the at least one power level P in each operation period (step 806). After the detected signal R is substantially stable, the sampling pulse generator 104 then generates a sampling pulse signal SH. The sample and hold circuit 112 then samples the level of the at least one detected signal R in the corresponding operation period according to the sample pulse signal SH to obtain a plurality of detected signal levels pi respectively corresponding to the power levels P. Because the detected signal levels pi are proportional to the power levels P, the compensator 114 then calibrates an update initial driving signal di according to the detected signal level pi and a target level. In one embodiment, the compensator 114 compares the detected signal level pi with a target level to generate a power level offset, and then adjusts the initial driving signal to have the update driving signal di according to the power level offset. The update driving component signal di is stored in the power initialization module for the normal data writing or next initial driving signal calibration. In one embodiment, the initial driving signal stored in the power initialization module is updated at each time the initial driving signal calibration performed. In the other embodiment, the initial driving signal stored in the power initialization module is updated when the initial driving signal calibration has a stable result which means the initial driving signal is stable.

In one embodiment, calibration of the update initial driving signal di comprises the following steps. First, the compensator 114 compares the detected level pi with the target level to generate a intermediated power level offset (step 808). The compensator 114 then adjusts the initial driving signal to have an intermediated initial driving signal according to the intermediated power level offset di (step 810). After the laser diode 118 generates a laser power P corresponding to the intermediated power level offset di, the front monitor diode 110 then detects a detected signal R, and the sample and hold circuit 112 samples the detected signal R to obtain an intermediated detected level pi (step 812). In one embodiment, after at least two detected levels are obtained, the compensator 114 performs an interpolated algorithm to get the updated driving signal di. The APC system 106 then determines whether the power level offset of the detected level and the target level is in a predetermined range (step 814). When the power level offset of the detected level and the target level is not in the predetermined range, the steps 808, 810, and 812 are recursively performed until the power level offset of the detected level and the target level is in the predetermined range, thus stabilizing the laser power.

Figure 14:
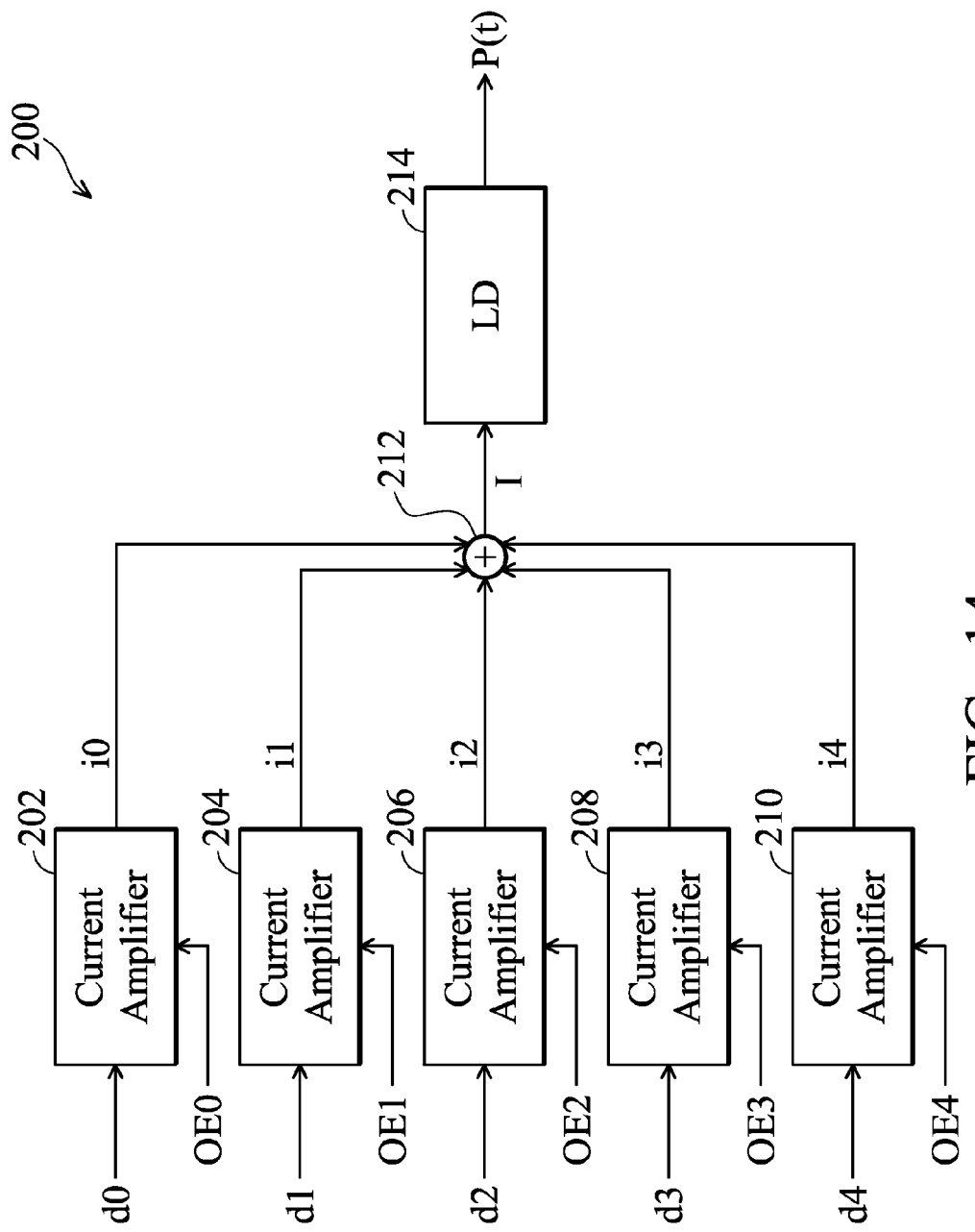
FIG. 14 is a block diagram of a laser diode driver according to one of the embodiments.

Referring to FIG. 14, a block diagram of a laser diode driver 200 according to one of the embodiments is shown. The laser diode driver 200 comprises a plurality of current amplifiers 202, 204, 206, 208, 210 and an adder 212. Each current amplifier corresponds to a specific power level. For example, the current amplifiers 202, 204, 206, 208, and 210 respectively correspond to a read power, a cooling power, an erase power, a write power, and an over drive power. The compensator 114 generates component current signals d0, d1, d2, d3, and d4 corresponding to the different power levels. When a driver enable signal OE0 corresponding to the read power is enabled, the current amplifier 202 then amplifies a component current signal d0 corresponding to the read power to obtain an amplified component driving current i0 corresponding to the read power. The current amplifiers 204, 206, 208, and 210 similarly operate with the current amplifier 202. The adder 212 then sums up the amplified component driving currents i0, i1, i2, i3, and i4 to form a driving current I. The laser driver 214 then generates a laserbeam with a power level P determined by the driving current I. The subsequent embodiments shown in FIGS. 17~20 illustrates details of an APC control method provided by the invention. The embodiments therefore only comprises a less number of power levels than the power levels shown in FIG. 14.

Figure 15:
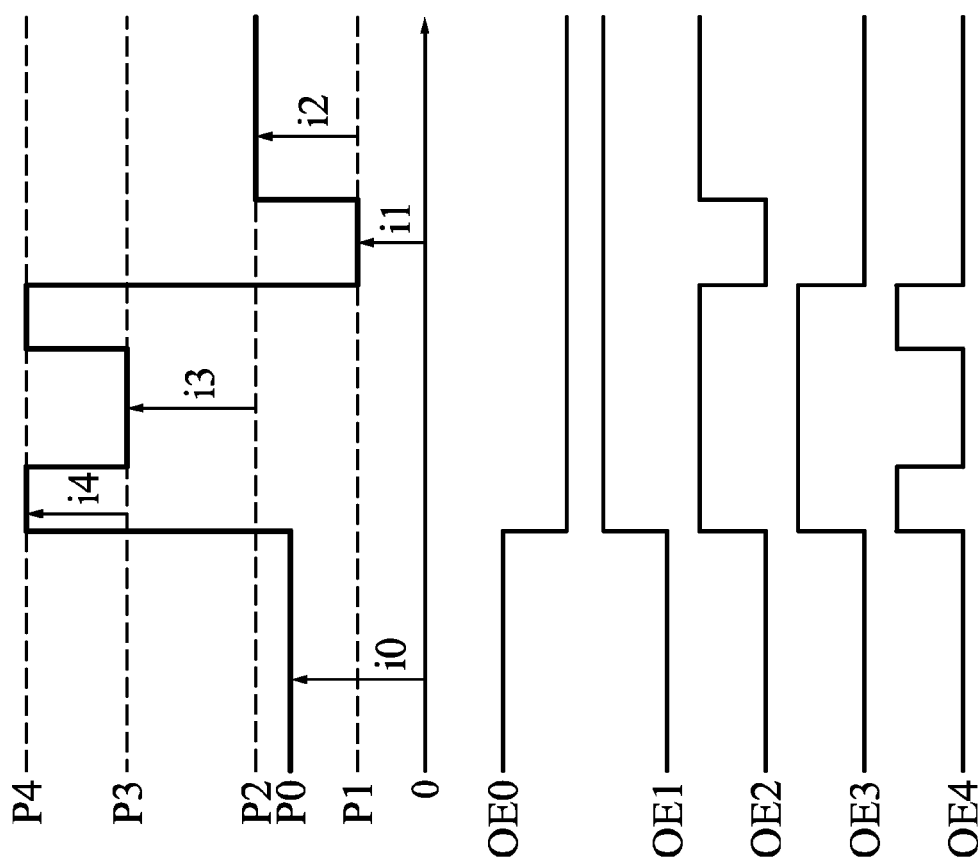
FIG. 15 is a schematic diagram of a relationship between a power level of a laserbeam and corresponding driver enable signals.

Referring to FIG. 15, a schematic diagram of a relationship between a power level P of a laserbeam and corresponding driver enable signals OE0~OE4 is shown. Assume that the laserbeam is sequentially emitted with a read power level P0, an over drive power P4, a write power level P3, the over drive power P4, a cooling power level P1, and an erase power level P2. The read power P0 requires a driving current equal to the amplified component driving current i0, and the driver enable signal OE0 is first enabled for generating the laserbeam with the read power level P0. The over drive power P4 requires a driving current equal to a sum of the amplified component driving currents i1, i2, i3, and i4, and the driver enable signals OE1, OE2, OE3, and OE4 are then enabled for generating the laserbeam with the over drive power P4. The write power P3 requires a driving current equal to a sum of the amplified component driving currents i1, i2, and i3, and the driver enable signals OE1, OE2, and OE3 are then enabled for generating the laserbeam with the write power level P3. The cooling power P1 requires a driving current equal to the amplified component driving current i1, and the driver enable signals OE1 is then enabled for generating the laserbeam with the cooling power level P1. Finally, the erase power P2 requires a driving current equal to a sum of the amplified component driving currents i1 and i2, and the driver enable signals OE1 and OE2 are then enabled for generating the laserbeam with the erase power level P2.

Figure 16:
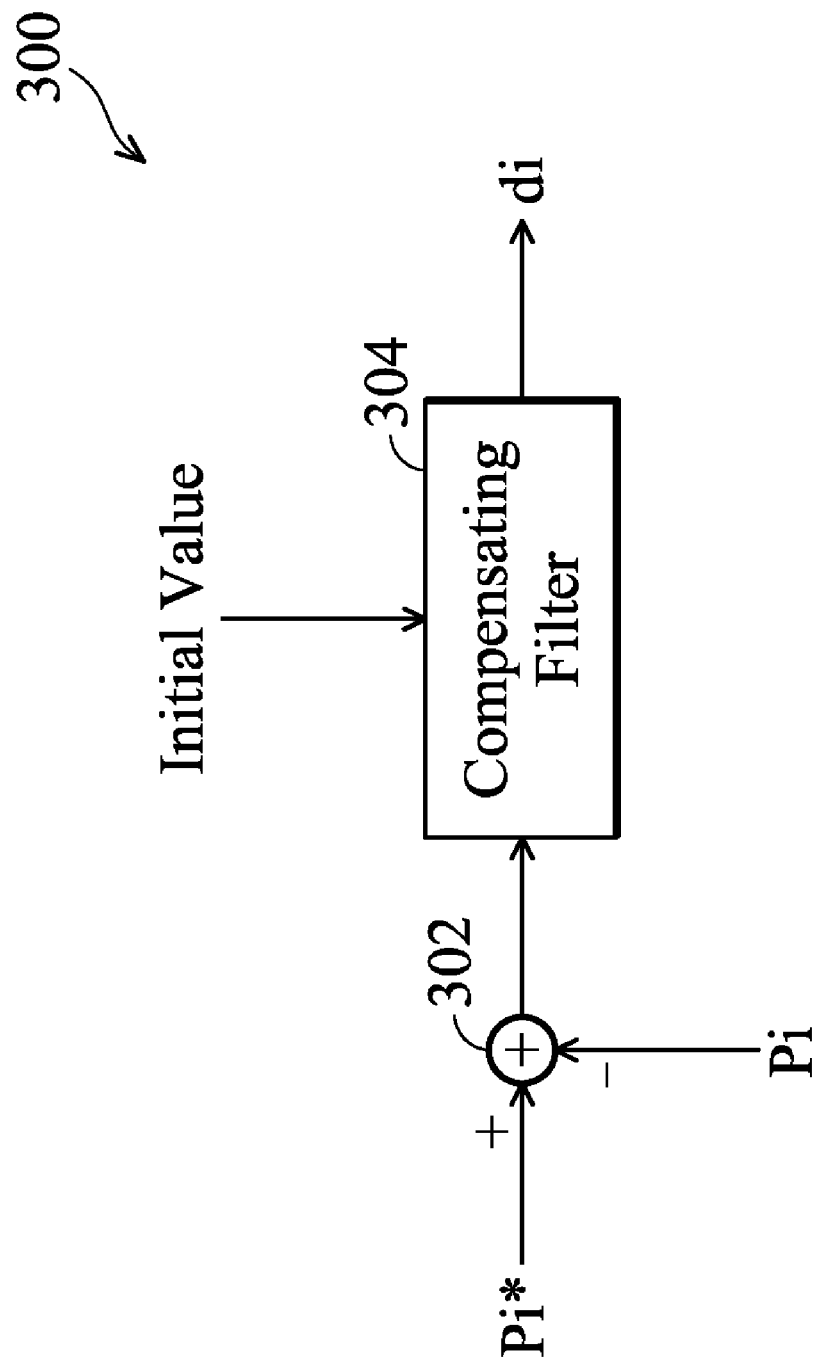
FIG. 16 is a block diagram of an embodiment of a compensator according to one of the embodiments.

Referring to FIG. 16, a block diagram of an embodiment of a compensator 300 according to one of the embodiments is shown. The compensator 300 comprises a subtractor 302 and a compensating filter 304. The compensator may have different forms. To make the steady state error zero, one simple method is by adopting an integrator described hereafter for easy description. The substractor 302 subtracts a detected signal level pi generated by the sample and hold circuit 112 from a target power level Pi* to obtain a power level offset. The compensating filter 304 then integrates the power level offset to obtain a component current signal di. The detected signal level pi, the target power level Pi*, and the component current signal di correspond to a read power, a cooling power, an erase power, a write power, or an over drive power. Since the APC control loop has bandwidth limit, there're some transient time for the laser beam to become stable with APC control. The transient time could make zero, if a proper initial di (for the integrator form is the initial value of it) is given. However, this initial di value not only depends on the target power, Pi, but also the laser diode temperature characteristics. So a method of finding this initial value before issuing disk recording is necessary. The power initialization module 120 therefore generates an initial value delivered to the compensator, and the compensating filter 304 start outputting from the initial value as the component current signal di after issuing disk recording. The subsequent laser driver 116 can then generate a driving current I according to the component current signal di to control generation of the laserbeam in the laser diode 118.

Figure 17:
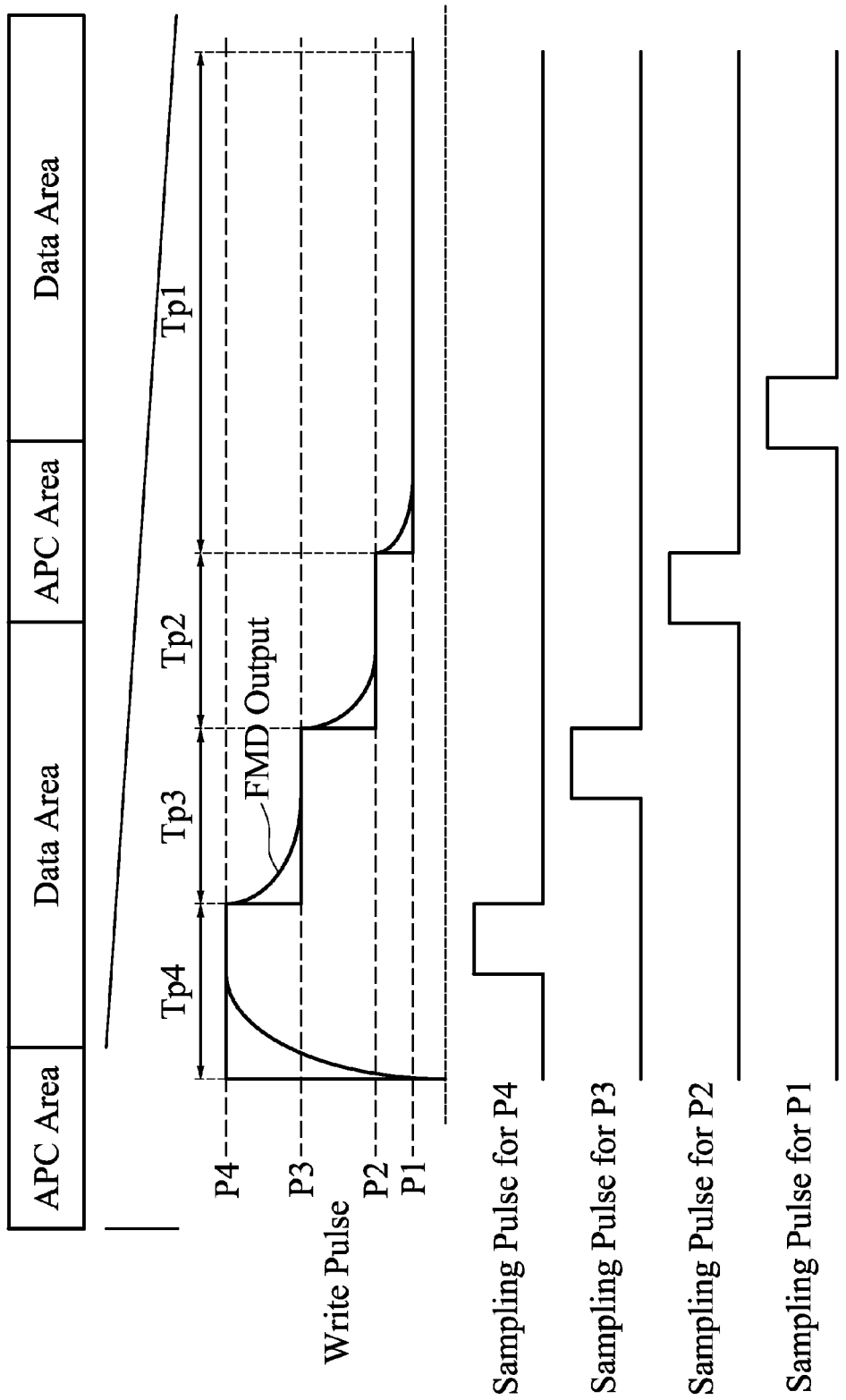
FIG. 17 is a schematic diagram of an embodiment of a test power pattern of a laser beam emitted by the laser diode according to one of the embodiments.

Referring to FIG. 17, a schematic diagram of an embodiment of a test power pattern of a laser beam emitted by the laser diode 118 according to one of the embodiments is shown. When the APC system 106 starts to perform an automatic power control process, the optical disk drive 100 moves a pickup head containing the laser diode 118 to an APC area of the optical disk. The laser diode 118 then sequentially projects a laserbeam with four power levels P4, P3, P2, and P1 onto the APC area. The first power level is the over drive power P4 and lasts for a duration period Tp4. The second power level is the write power level P3 and lasts for a duration period Tp3. The third power level is the erase power level P2 and lasts for a duration period Tp2. The fourth power level is the cooling power level P1 and lasts for a duration period Tp1. The front monitor diode 110 then detects the laserbeam to output a detected signal, wherein the duration periods Tp1, Tp2, Tp3, and Tp4 are greater than the settling time of the front monitor diode 110 to generate a stable detected signal. Because the front monitor diode 110 can generate a detected signal that accurately representing the power level of the laserbeam, the compensator 114 can generate component current signals according to the detected signal to make a laserbeam output a precise power level. The sample and hold circuit 112 then samples the detected signal according to sampling pulses generated by the sampling pulse generator 104 to obtain the detected signal levels p4, p3, p2, and p1 respectively corresponding to the power levels P4, P3, P2, and P1. The compensator 114 can then generate the component current signals d0, d1, d2, d3, and d4 according to the detected signal levels p4, p3, p2, and p1 to calibrate the driving current I of the laser diode deriver 116, thus making the laser diode 118 generate a laserbeam with a constant power level.

Figure 18:
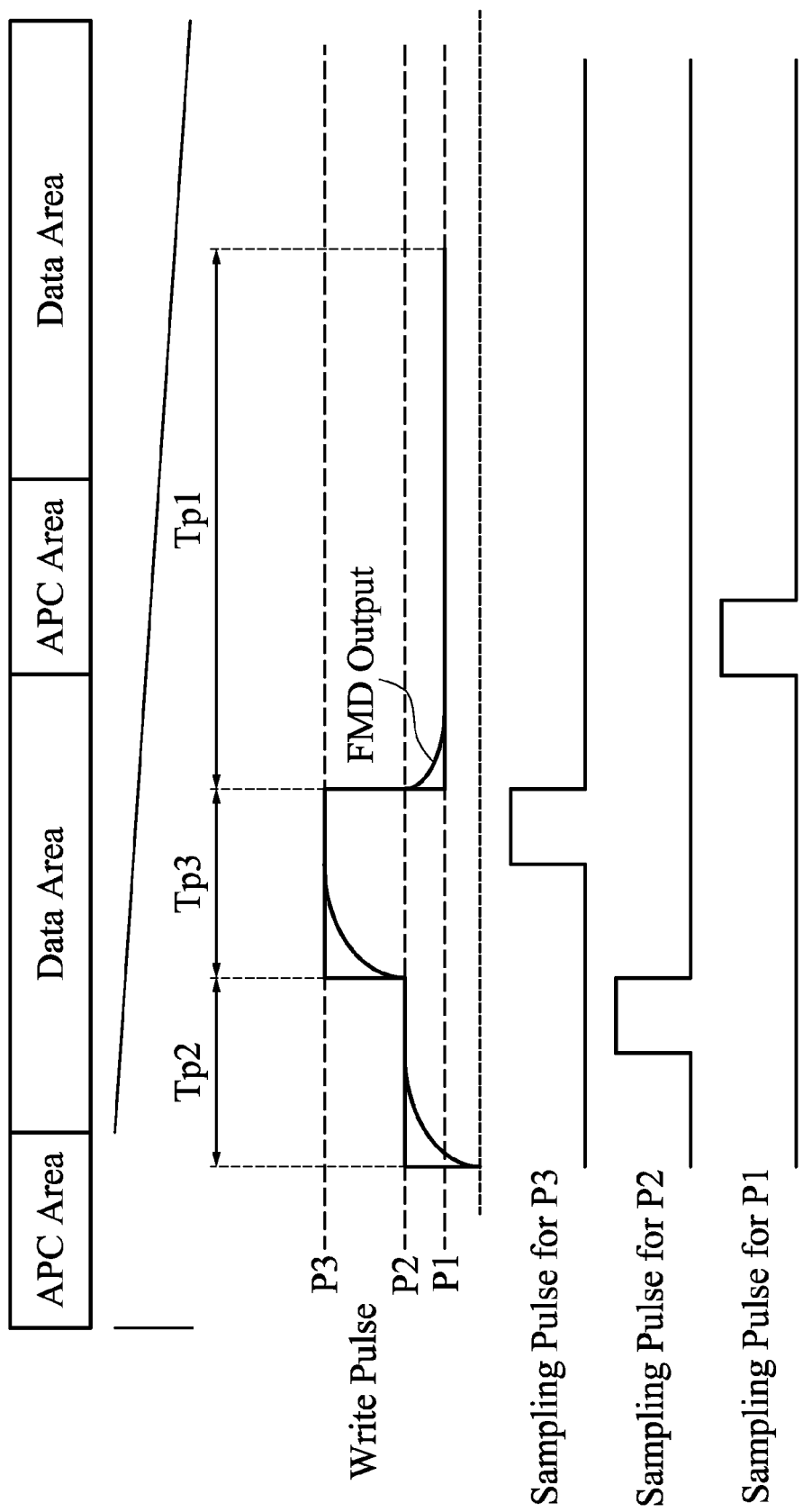
FIG. 18 is a schematic diagram of another embodiment of a test power pattern of a laser beam emitted by the laser diode according to one of the embodiments.

Referring to FIG. 18, a schematic diagram of another embodiment of a test power pattern of a laser beam emitted by the laser diode 118 according to one of the embodiments is shown. In the embodiment, the laser diode 118 sequentially projects a laserbeam with three power levels P2, P3, and P1 onto the APC area. The first power level is the erase power level P2 lasting for a duration period Tp2. The second power level is the write power level P3 lasting for a duration period Tp3. The third power level is the cooling power level P1 lasting for a duration period Tp1. After the front monitor diode 110 detects reflection of the laserbeam to output a detected signal, the sample and hold circuit 112 samples the detected signal according to sampling pulses generated by the sampling pulse generator 104 to obtain the detected signal levels p2, p3, and p1 respectively corresponding to the power levels P2, P3, and P1. The compensator 114 can then generate the component current signals d0, d1, d2, d3, and d4 according to the detected signal levels p2, p3, and p1 to calibrate the driving current I of the laser diode deriver 116, thus making the laser diode 118 generate a laserbeam with a constant power level.

In the embodiments shown in FIGS. 17 and 18, the optical disk drive 100 respectively generates laserbeams with four power levels and three power levels for driving current calibration. The sample and hold circuit 112 therefore respectively obtains four detected signal levels and three detected signal levels corresponding to the power levels. The compensator 114, however, has to generate five component current signals d0, d1, d2, d3, and d4 according to the four detected signal levels or the three detected signal levels. Referring to FIG. 4, an approximate relationship line between a driving current and a laserbeam power level at a specific temperature T is determined by an offset current Ith(T) and a slope s(T). The APC system 106 can therefore determine the offset current Ith(T) and the slope s(T) according to the detected signal levels sampled by the sample and hold circuit 112, and then estimate all five component current signals d0, d1, d2, d3, and d4 of a driving current corresponding to a specific power level according to the offset current Ith(T) and the slope s(T). An embodiment of power level equations for estimating power levels according to the offset current Ith(T) and the slope s(T) is shown as following:

$P0 = (i0 - Ith(T)) \times s(T);$ $P1 = (i1 - Ith(T)) \times s(T);$ $P2 = P1 + i2 \times s(T);$ $P3 = P2 + i3 \times s(T);$ and $P4 = P3 + i4 \times s(T),$ wherein P0 is a read power level, P1 is a cooling power level, P2 is an erase power level, P3 is a write power level, P4 is an over drive power, and i0, i1, i2, i3, and i4 are amplified component driving currents shown in FIG. 15.

Figure 19:
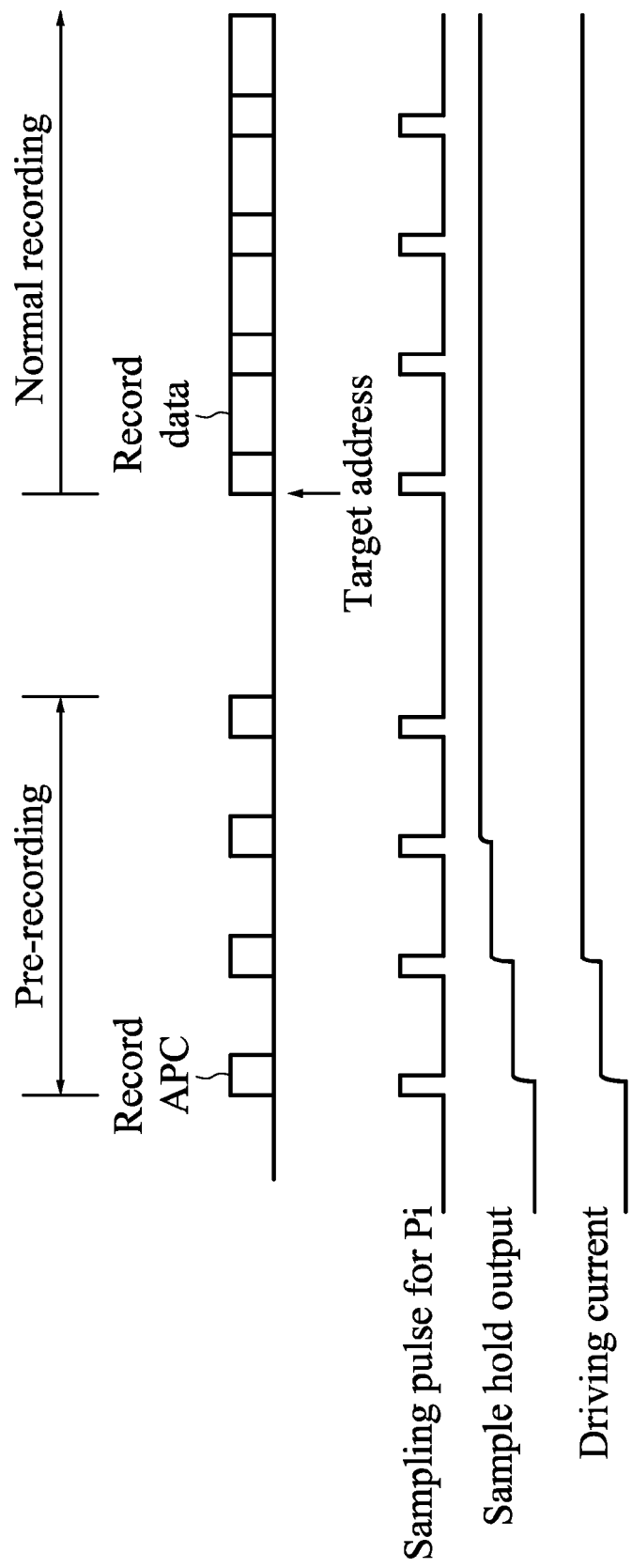
FIG. 19 is a schematic diagram of an embodiment of automatic power initialization with a pre-recording process according to one of the embodiments.

When the optical disk drive is powered on, the optical disk drive 100 does not know the temperature of the laser diode 118. The laser diode driver 116 therefore cannot determine an amplitude of the driving current I for controlling the laser diode 118 to generate a laserbeam with a desired power level. The optical disk drive 100 therefore performs an automatic power initialization process to calibrate the driving current I before the optical disk drive 100 formally writes data. The automatic power initialization process before normal data writing is also referred to as a pre-recording process where APC area are used for calibrating initial driving signal di while data area are leaving as normal data reading (i.e. laser beam outputting read power). Referring to FIG. 19, a schematic diagram of an embodiment of a pre-recording process according to one of the embodiments is shown. In this embodiment, before an optical disk drive records data on a target address of an optical disk, the optical disk drive performs the pre-recording process to write test data on APC areas near and prior to the target address. In other embodiments, the optical disk drive may perform the pre-recording process to write test data on any APC areas and then seek to the target address after completing the pre-recording process. For simplification, a ordinary APC control structure is used to illustrate implementation of the automatic power initialization of the invention, but the APC control structure does not limit the application range of the invention. When the pre-recording process is started, the APC system 106 performs a first automatic power control process (i.e. APC) on a first APC area, thus making a first adjustment di according to a detected signal level pi of the laserbeam. After a projection spot of the laserbeam leaves the first APC area, the APC system then halts emission of the laserbeam until the pickup head reaches a second APC area. The APC system 106 then sequentially performs another three automatic power control processes on subsequent three APC areas, thus making another three adjustments to the detected signal level pi of the laserbeam. The three automatic power control processes performed on subsequent three APC areas are only for illustration. When the APC bandwidth gets lower or the current laser power has a greater offset in comparison with a target laser power, the APC system 106 must performs a greater number of automatic power control processes on a greater number of APC areas to obtain a converged laserbeam power level. Finally, the detected signal level pi is equal to a target power level, and calibration of the driving current is completed. The optical disk drive 100 then performs normal data recording process with correct laser power when the target address is met.

Figure 20:
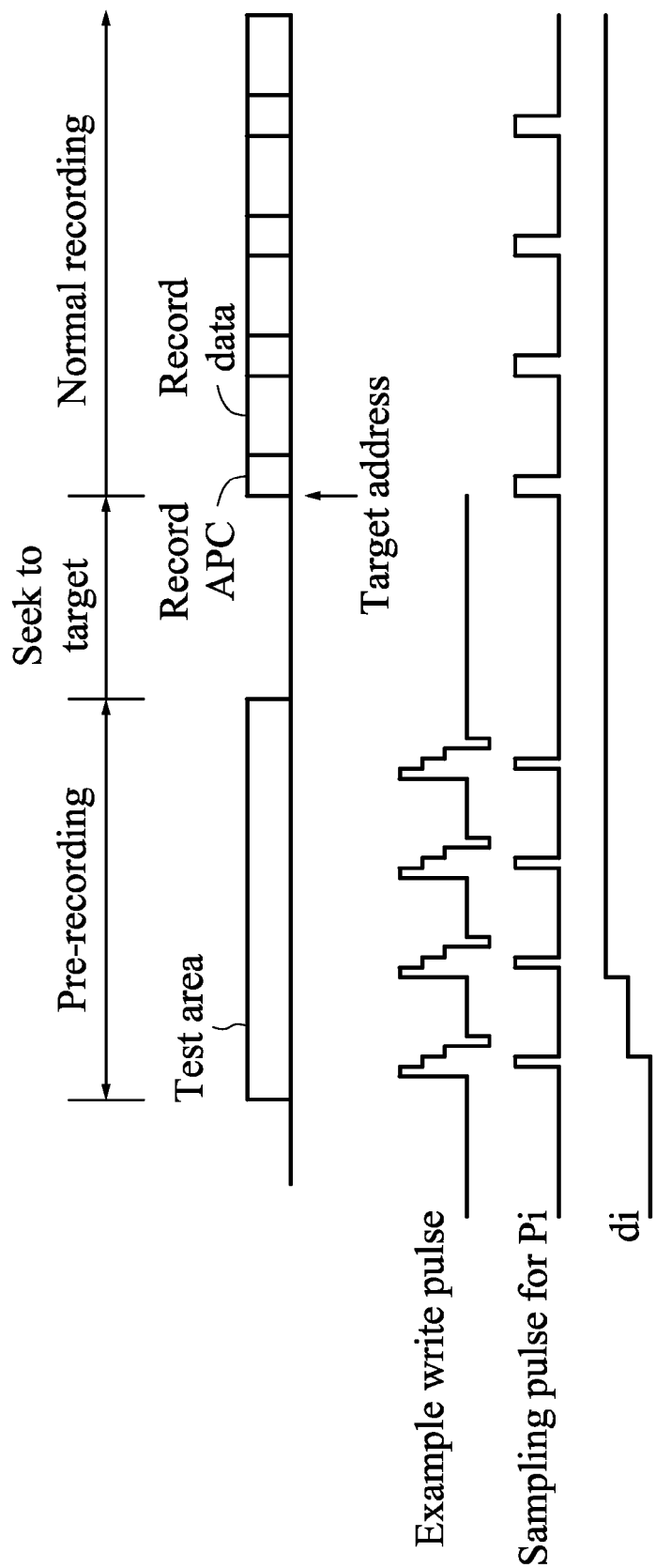
FIG. 20 is a schematic diagram of another embodiment of automatic power initialization with a pre-recording process according to one of the embodiments.

Referring to FIG. 20, a schematic diagram of another embodiment of a pre-recording process is shown. In the pre-recording process, the optical disk drive 100 moves the pickup head containing the laser diode 118 to an APC area of the optical disk, and performs four automatic power control processes on the APC area to make four adjustments to a power level of the laserbeam. In one embodiment, the APC area is an APC area or an optimal power control (OPC) area of the optical disk. After calibration of the power level Pi is completed, the optical disk drive 100 then moves the pickup head containing the laser diode 118 to a target address for normally recording data.

While one of the embodiments has been described by way of example and in terms of preferred embodiment, it is to be understood that one of the embodiments is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for calibrating an initial driving signal for driving an optical pick-up head of an optical disk drive, said optical disk drive is utilized for reading or writing data on an optical disk, the optical disk comprising a plurality of auto power control areas (APC areas) and a plurality of data areas, the APC areas and the data areas are interleaved in between, the method comprising:
   in the APC areas, using an initial driving signal to drive the optical pick-up head to emit laserbeam;
   obtaining a detected level of the laserbeam; and
   calibrating an update initial driving signal according to the detected level and a target level.

2. The method as claimed in claim 1, wherein calibrating of the update initial driving signal comprises:
   comparing the detected level with the target level to generate a power level offset; and
   adjusting the initial driving signal to have the update driving signal according to the power level offset.

3. The method as claimed in claim 1, wherein the initial driving signal is used to drive a read power, a cooling/bias power, an erase power, a write power, or an over drive power.

4. The method as claimed in claim 1, wherein the optical disk is a blu-ray disk (BD).

5. The method as claimed in claim 1, wherein calibrating of the update initial driving signal comprises:
   (a) comparing the detected level with the target level to generate a intermediated power level offset;
   (b) adjusting the initial driving signal to have an intermediated initial driving signal according to the intermediated power level offset;
   (c) obtaining an intermediated detected level;
   (d) determining the updated initial driving signal by repeating the steps (a), (b), and (c).

6. The method as claimed in claim 5, wherein the determined step is to get at least two detected levels to perform an interpolated algorithm to get the updated driving signal.

7. The method as claimed in claim 5, wherein the determined step is to perform the steps (a), (b), and (c) recursively till the power level offset of the detected level and the target level is in a predetermined range.

8. An automatic power control system of an optical disk drive having a pick-up head with a front monitor diode, said optical disk drive is utilized for reading or writing data on an optical disk, the optical disk comprising a plurality of auto power control areas (APC areas) and a plurality of data areas, the APC areas and the data areas are interleaved in between, the system comprising:
   a power initialization unit, in the APC areas, for outputting an initial driving signal to drive the optical pick-up head to emit laserbeam; and
   a compensator, for obtaining a detected level of the laserbeam detected by the front monitor diode, and calibrating an update initial driving signal according to the detected level and a target level.

9. The system as claimed in claim 8, wherein the initial driving signal is used to drive a read power, a cooling/bias power, an erase power, a write power, or an over drive power.

10. The system as claimed in claim 8, wherein the optical disk is a blu-ray disk (BD).

11. The system as claimed in claim 8, wherein the compensator calibrating the update initial driving signal by:
    comparing the detected level with the target level to generate a power level offset; and
    adjusting the initial driving signal to have the update driving signal according to the power level offset.

12. The system as claimed in claim 8, wherein the compensator calibrating the update initial driving signal by:
    (a) comparing the detected level with the target level to generate a intermediated power level offset;
    (b) adjusting the initial driving signal to have an intermediated initial driving signal according to the intermediated power level offset;
    (c) obtaining the intermediated detected level of the laserbeam detected by the front monitor diode;
    (d) determining the updated initial driving signal by repeating the steps (a), (b), and (c).

13. The system as claimed in claim 12, wherein the compensator gets at least two detected levels to perform an interpolated algorithm to get the updated initial driving signal.

14. The system as claimed in claim 12, wherein the compensator performs the steps (a), (b), and (c) recursively till the power level offset of the detected level and the target level is in a predetermined range.

15. An automatic power control system for an optical disc drive to control the power of a laser beam, wherein the optical disc drive comprises a optical pickup head for receiving a driving signal to generate the laser beam and a front monitor diode for detecting the laser beam to generate an analog input signal, the automatic power control system comprising:

- an analog-to-digital converter, converting the analog input signal into digital data;
- a compensator, coupled to the analog-to-digital converter, when a compensating trigger signal is enabled, generating at least one component driving data according to the digital data and a target level; and
- a controller, coupled to the analog-to-digital converter and the compensator, enabling a compensating trigger signal;
- a digital-to-analog converter, coupled to the compensator, converting the component driving data to analog to generate a component driving signal.

16. The automatic power control system as claimed in claim 15, wherein the automatic power control system further comprises:

- at least one filter, coupled between the analog-to-digital converter and the compensator, filtering the digital data when a filter trigger signal is enabled;
- wherein the controller enables the filter trigger signal when the automatic power control is performed.

17. The automatic power control system as claimed in claim 15, wherein the compensator comprises:

- at least one subtractor, for subtracting the digital data from the target level to obtain a power level offset; and
- a compensating filter, for filtering the power level offset to generate the component driving data.

18. A method for automatic power control for an optical disc drive, wherein the optical disc drive comprises an optical pick up head for receiving a driving signal to generate a laser beam and a front monitor diode for detecting the laser beam to generate an analog input signal, the method comprising:

- enabling a compensating trigger signal;
- converting the analog input signal into digital data when a digitizing trigger signal is enabled;
- generating at least one component driving data according to the digital data and a target level when a compensating trigger signal is enabled; and
- converting the component driving data to analog to generate a component driving signal.

19. The method as claimed in claim 18, further comprises:

- when a filter trigger signal is enabled, filtering the digital data with at least one filter coupled between the analog-to-digital converter and the compensator.

20. The method as claimed in claim 18, wherein generation of the at least one component driving signal comprises:

- subtracting the digital data from the target level to obtain a power level offset; and
- filtering the power level offset to generate the component driving signal.

* * * * *